United States Patent
Kubota

(10) Patent No.: US 9,859,101 B2
(45) Date of Patent: Jan. 2, 2018

(54) PLASMA PROCESSING APPARATUS AND PLASMA PROCESSING METHOD

(71) Applicant: TOKYO ELECTRON LIMITED, Tokyo (JP)

(72) Inventor: Shinji Kubota, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 15/591,197

(22) Filed: May 10, 2017

(65) Prior Publication Data

US 2017/0330730 A1    Nov. 16, 2017

(30) Foreign Application Priority Data

May 10, 2016   (JP) .................................. 2016-094340
May 8, 2017    (JP) .................................. 2017-092199

(51) Int. Cl.
*H05B 31/26*      (2006.01)
*H01J 37/32*      (2006.01)

(52) U.S. Cl.
CPC .. *H01J 37/32165* (2013.01); *H01J 37/32146* (2013.01); *H01J 37/32816* (2013.01)

(58) Field of Classification Search
CPC ........... H01J 37/32935; H01J 37/32972; H01J 37/3299; H01J 37/32082; H01J 37/32623; H01J 37/32174; H01J 37/32192; H01J 37/321; H01L 21/67253; H01L 21/67069; H05H 1/24; H05H 1/46; B82Y 10/00
See application file for complete search history.

(56) References Cited

U.S. PATENT DOCUMENTS

2005/0009347 A1*  1/2005  Matsumoto ............ G01N 21/68
                                                  438/689
2007/0188104 A1*  8/2007  Chistyakov ....... H01J 37/32009
                                                  315/111.21

FOREIGN PATENT DOCUMENTS

EP    2 533 268 B1   3/2014
JP    2012-15534 A   1/2012

* cited by examiner

*Primary Examiner* — Minh D A
(74) *Attorney, Agent, or Firm* — Rothwell, Figg, Ernst & Manbeck, P.C.

(57) ABSTRACT

A plasma processing apparatus includes a processing chamber, a carrier wave group generation unit and a plasma generation unit. The carrier wave group generation unit is configured to generate a carrier wave group including a plurality of carrier waves having different frequencies in a frequency domain. The carrier wave group is represented by an amplitude waveform in which a first peak and a second peak of which absolute value is smaller than an absolute value of the first peak alternately appear in a time domain. The plasma generation unit is configured to generate a plasma in the processing chamber by using the carrier wave group.

11 Claims, 27 Drawing Sheets

CENTRAL FREQUENCY fc=13.56MHz

FIG. 27
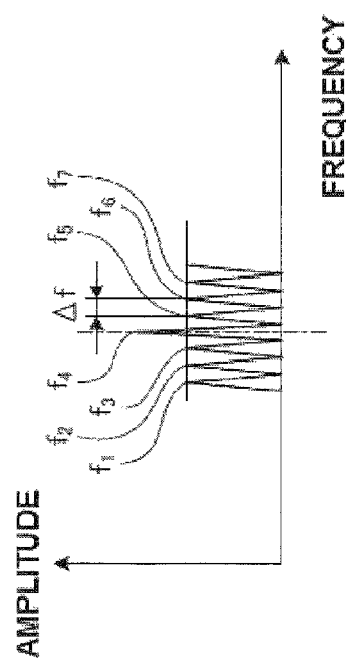
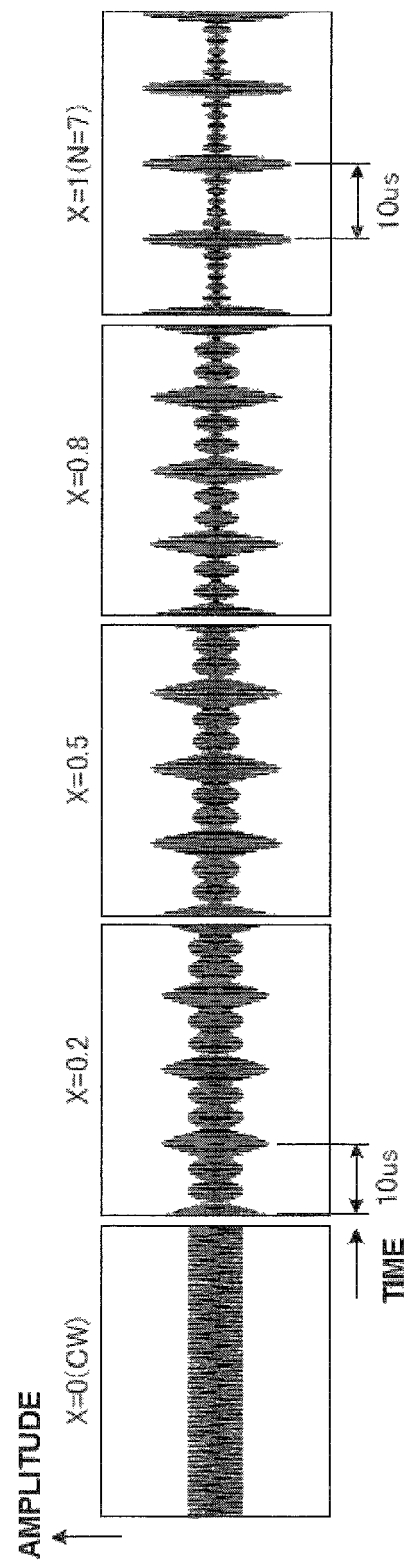

FIG.28A

| CENTRAL FREQUENCY | 13.56 | MHz |
|---|---|---|
| N number | 13 | |
| Δf | 100 | kHz |

| SYMBOL | ON/OFF | FREQUENCY [MHz] | INITIAL PHASE [°] | RELATIVE POWER |
|---|---|---|---|---|
| f1 | ON | 12.96 | −180 | 0.0769 |
| f2 | ON | 13.06 | −90 | 0.0769 |
| f3 | ON | 13.16 | 0 | 0.0769 |
| f4 | ON | 13.26 | −270 | 0.0769 |
| f5 | ON | 13.36 | −180 | 0.0769 |
| f6 | ON | 13.46 | −90 | 0.0769 |
| f7 | ON | 13.56 | 0 | 0.0769 |
| f8 | ON | 13.66 | 90 | 0.0769 |
| f9 | ON | 13.76 | 180 | 0.0769 |
| f10 | ON | 13.86 | 270 | 0.0769 |
| f11 | ON | 13.96 | 0 | 0.0769 |
| f12 | ON | 14.06 | 90 | 0.0769 |
| f13 | ON | 14.16 | 180 | 0.0769 |

FIG.28B

| CENTRAL FREQUENCY | 13.56 | MHz |
|---|---|---|
| N number | 7 | |
| Δf | 10 | kHz |

| SYMBOL | ON/OFF | FREQUENCY [MHz] | INITIAL PHASE [°] | RELATIVE POWER |
|---|---|---|---|---|
| f1 | OFF | | | 0.0000 |
| f2 | OFF | | | 0.0000 |
| f3 | OFF | | | 0.0000 |
| f4 | ON | 13.53 | −270 | 0.1429 |
| f5 | ON | 13.54 | −180 | 0.1429 |
| f6 | ON | 13.55 | −90 | 0.1429 |
| f7 | ON | 13.56 | 0 | 0.1429 |
| f8 | ON | 13.57 | 90 | 0.1429 |
| f9 | ON | 13.58 | 180 | 0.1429 |
| f10 | ON | 13.59 | 270 | 0.1429 |
| f11 | OFF | | | 0.0000 |
| f12 | OFF | | | 0.0000 |
| f13 | OFF | | | 0.0000 |

FIG.28C

| CENTRAL FREQUENCY | 13.56 | MHz |
|---|---|---|
| N number | 13 | |
| Δf | 10 | kHz |

| SYMBOL | ON/OFF | FREQUENCY [MHz] | INITIAL PHASE [°] | RELATIVE POWER |
|---|---|---|---|---|
| f1 | ON | 13.50 | −180 | 0.0769 |
| f2 | ON | 13.51 | −90 | 0.0769 |
| f3 | ON | 13.52 | 0 | 0.0769 |
| f4 | ON | 13.53 | −270 | 0.0769 |
| f5 | ON | 13.54 | −180 | 0.0769 |
| f6 | ON | 13.55 | −90 | 0.0769 |
| f7 | ON | 13.56 | 0 | 0.0769 |
| f8 | ON | 13.57 | 90 | 0.0769 |
| f9 | ON | 13.58 | 180 | 0.0769 |
| f10 | ON | 13.59 | 270 | 0.0769 |
| f11 | ON | 13.60 | 0 | 0.0769 |
| f12 | ON | 13.61 | 90 | 0.0769 |
| f13 | ON | 13.62 | 180 | 0.0769 |

FIG.28D

| CENTRAL FREQUENCY | 13.56 | MHz |
|---|---|---|
| N number | 10 | |
| Δf | 10 | kHz |

| SYMBOL | ON/OFF | FREQUENCY [MHz] | INITIAL PHASE [°] | RELATIVE POWER |
|---|---|---|---|---|
| f1 | ON | 13.54 | −180 | 0.1000 |
| f2 | ON | 13.55 | −90 | 0.1000 |
| f3 | ON | 13.56 | 0 | 0.1000 |
| f4 | ON | 13.57 | 90 | 0.1000 |
| f5 | ON | 13.58 | 180 | 0.1000 |
| f6 | ON | 13.54 | −180 | 0.1000 |
| f7 | ON | 13.55 | −90 | 0.1000 |
| f8 | ON | 13.56 | 0 | 0.1000 |
| f9 | ON | 13.57 | 90 | 0.1000 |
| f10 | ON | 13.58 | 180 | 0.1000 |
| f11 | OFF | | | |
| f12 | OFF | | | |
| f13 | OFF | | | |

PLASMA PROCESSING APPARATUS AND PLASMA PROCESSING METHOD

CROSS-REFERENCE TO RELATED APPLICATIONS

This application claims priority to Japanese Patent Application Nos. 2016-094340 and 2017-092199, respectively filed on May 10, 2016 and May 8, 2017, the entire contents of which are incorporated herein by reference.

FIELD OF THE INVENTION

The disclosure relates to a plasma processing apparatus and a plasma processing method.

BACKGROUND OF THE INVENTION

Conventionally, there is known a plasma processing apparatus for generating a plasma in a processing chamber by using a high frequency power generated by a high frequency power supply. In addition, there is a technique for generating a plurality of high frequency powers having different frequencies by using a plurality of high frequency power supplies (see, e.g., Japanese Patent Application Publication No. 2012-015534).

However, in the case of generating the plasma in the processing chamber by using the high frequency power generated by the high frequency power supply, it is difficult to stably maintain the plasma under an environment of a low pressure and a low plasma density. For example, in order to maintain the plasma under a low pressure environment, it is considered to increase the high frequency power generated by the high frequency power supply. However, when the high frequency power is increased, an electric field in the processing chamber is increased. Accordingly, ionization of the plasma is accelerated and, thus, the plasma density may be excessively increased.

In order to suppress the excessive increase in the plasma density, it is considered to decrease the high frequency power to a level smaller than that at the time of plasma generation (ignition) after the plasma generation (ignition). However, when the high frequency power is decreased, the electric field in the processing chamber is decreased. Therefore, the electric field that is enough to maintain the plasma is not ensured. As a consequence, the plasma may be lost. From the above, a low frequency is preferred in order to obtain high ion energy by a conventional CCP (Capacitively Coupled Plasma) type plasma apparatus. Since, however, ion energy distribution becomes broader, it is difficult to accurately control the ion energy by suppressing the ion energy distribution.

SUMMARY OF THE INVENTION

In view of the above, the disclosure provides a plasma processing apparatus and a plasma processing method which are capable of stably maintaining a plasma under an environment of a low pressure and a low plasma density and providing improved controllability of the ion energy distribution.

In accordance with an aspect, there is provided a plasma processing apparatus including a processing chamber, a carrier wave group generation unit and a plasma generation unit. The carrier wave group generation unit is configured to generate a carrier wave group including a plurality of carrier waves having different frequencies in a frequency domain. The carrier wave group is represented by an amplitude waveform in which a first peak and a second peak of which absolute value is smaller than an absolute value of the first peak alternately appear in a time domain. The plasma generation unit is configured to generate a plasma in the processing chamber by using the carrier wave group.

In accordance with an embodiment of the plasma processing apparatus, by controlling the waveform, the distribution of the ion energy and the absolute value of the ion energy can be controlled in a narrow range and, also, the plasma can be stably maintained under an environment of a low pressure and a low plasma density.

BRIEF DESCRIPTION OF THE DRAWINGS

The objects and features of the disclosure will become apparent from the following description of embodiments, given in conjunction with the accompanying drawings, in which:

FIG. 27 shows examples of waveforms of electrical signals of a carrier wave group in the case of varying an amplitude of a carrier wave;

FIGS. 28A to 28D show examples of specification of carrier waves;

DETAILED DESCRIPTION OF THE EMBODIMENTS

Figure 1:
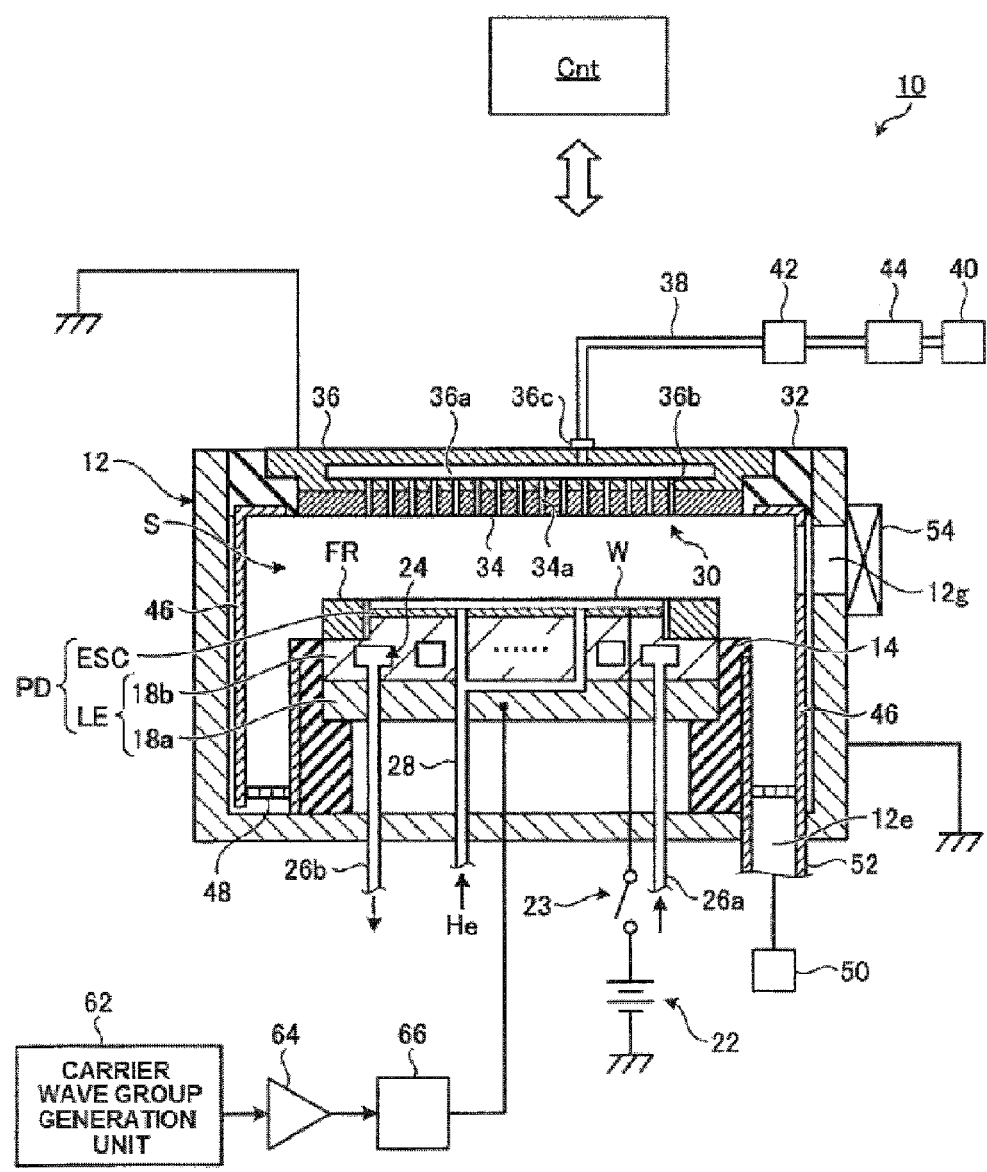
FIG. 1 shows a plasma processing apparatus according to a first embodiment.

Hereinafter, embodiments of a plasma processing apparatus and a plasma processing method will be described in detail with reference to the accompanying drawings. Like reference numerals will be used for like or corresponding parts throughout the drawings. The disclosure is not limited to the embodiments. The embodiments may be combined appropriately without contradicting processing contents.

First Embodiment

FIG. 1 shows a plasma processing apparatus according to a first embodiment. A plasma processing apparatus 10 shown in FIG. 1 is configured as a plasma processing apparatus using a CCP (Capacitively Coupled Plasma). The plasma processing apparatus 10 includes a substantially cylindrical processing chamber 12. The processing chamber has an inner wall surface made of, e.g., anodically oxidized aluminum. The processing chamber 12 is frame grounded.

A substantially cylindrical support 14 is provided on a bottom portion of the processing chamber 12. The support is made of, e.g., an insulating material. In the processing chamber 12, the support 14 extends vertically from the bottom portion of the processing chamber 12. A mounting table PD is provided in the processing chamber 12. The mounting table PD is supported by the support 14.

The mounting table PD mounts a wafer on a top surface thereof. The mounting table PD includes a lower electrode LE and an electrostatic chuck ESC. The lower electrode LE has a first plate 18a and a second plate 18b. The first plate 18a and the second plate 18b are made of metal, e.g., aluminum, and formed in a substantially disc shape. The second plate 18b is provided on the first plate 18a and electrically connected to the first plate 18a.

The electrostatic chuck ESC is provided on the second plate 18b. The electrostatic chuck ESC has a structure in which an electrode made of a conductive film is embedded between two insulating layers or two insulating sheets. A DC power supply 22 is electrically connected to the electrode of the electrostatic chuck ESC via a switch 23. The wafer W can be attracted and held on the electrostatic chuck ESC by an electrostatic force such as a Coulomb force generated by a DC voltage applied from the DC power supply 22.

A focus ring FR is provided on a peripheral portion of the second plate 18b to surround the edge of the wafer W and the electrostatic chuck ESC. The focus ring FR is provided to improve in-plane uniformity of the etching. The focus ring FR is made of a material that is appropriately selected depending on a material of an etching target film. For example, the focus ring FR may be made of quartz.

A coolant path 24 is provided in the second plate 18b. The coolant path 24 constitutes a temperature control mechanism. A coolant is supplied to the coolant path 24 from a chiller unit provided outside the processing chamber 12 through a line 26a. The coolant flowing in the coolant path 24 returns to the chiller unit through a line 26b. The coolant circulates through the coolant path 24. A temperature of the wafer W held on the electrostatic chuck ESC is controlled by controlling a temperature of the coolant.

The plasma processing apparatus 10 further includes a gas supply line 28. The gas supply line 28 supplies a heat transfer gas, e.g., He gas, from a heat transfer gas supply unit to a gap between a top surface of the electrostatic chuck ESC and a backside of the wafer W.

The plasma processing apparatus 10 further includes an upper electrode 30. The upper electrode 30 is provided above the mounting table PD to face the mounting table PD. The lower electrode LE and the upper electrode 30 are disposed approximately parallel to each other. Between the upper electrode 30 and the lower electrode LE, a processing space S where plasma processing is performed on the wafer W is defined.

The upper electrode 30 is held at an upper portion of the processing chamber 12 through an insulating shield member 32. The upper electrode 30 is connected to GND. In one embodiment, the upper electrode 30 may be configured such that a vertical distance between the upper electrode 30 and the top surface of the mounting table PD, i.e., a wafer mounting surface, is variable. The upper electrode 30 may include an electrode plate 34 and an electrode holder 36. The electrode plate 34 is exposed to the processing space S and has a plurality of gas injection openings 34a. In one embodiment, the electrode plate 34 is made of silicon.

The electrode holder 36 detachably holds the electrode plate 34 and is made of a conductive material, e.g., aluminum. The electrode holder 36 may have a water cooling structure. A gas diffusion space 36a is provided in the electrode holder 36. A plurality of gas holes 36b communicating with the gas injection openings 34a extend downward from the gas diffusion space 36a. Further, the electrode holder 36 includes a gas inlet port 36c for guiding a processing gas into the gas diffusion space 36a. A gas supply line 38 is connected to the gas inlet port 36c.

A gas source group 40 is connected to the gas supply line 38 through a flow rate controller group 44 and a valve group 42. The gas source group 40 includes a plurality of gas sources such as a fluorocarbon gas source, a rare gas source and an oxygen ($O_2$) gas source. A fluorocarbon gas is a gas containing at least one of $C_4F_6$ gas and $O_4F_8$ gas. A rare gas is a gas containing at least one of various rare gases such as Ar gas and He gas.

The valve group 42 includes a plurality of valves. The flow rate controller group 44 includes a plurality of flow rate controllers such as mass flow controllers. The respective gas sources of the gas source group 40 are connected to the gas supply line 38 through corresponding valves of the valve group 42 and corresponding flow rate controllers of the flow rate controller group 44.

In the plasma processing chamber 10, a deposition shield 46 is detachably provided to an inner wall of the processing chamber 12. The deposition shield 46 is also provided at an outer periphery of the support 14. The deposition shield 46 prevents etching by-products (deposits) from being adhered to the processing chamber 12. The deposition shield 46 may be formed by coating aluminum with ceramic such as $Y_2O_3$ or the like.

At a lower side in the processing chamber 12, a gas exhaust plate 48 is provided between the support 14 and a sidewall of the processing chamber 12. The gas exhaust plate 48 may be formed by coating aluminum with ceramic, e.g., $Y_2O_3$ or the like. In the processing chamber 12, a gas exhaust port 12e is provided below the gas exhaust plate 48. A gas exhaust unit 50 is connected to the gas exhaust port 12e through a gas exhaust line 52. The gas exhaust unit 50 has a vacuum pump such as a turbo molecular pump or the like, so that a pressure in the space in the processing chamber 12 can be decreased to a predetermined vacuum level. A loading/unloading port 12g for the wafer W is provided at the sidewall of the processing chamber 12. The loading/unloading port 12g can be opened and closed by a gate valve 54.

As shown in FIG. 1, the plasma processing apparatus 10 further includes a carrier wave group generation unit 62, an amplifier 64, and a matching unit 66.

The carrier wave group generation unit 62 generates a carrier wave group. The carrier wave group generated by the carrier wave group generation unit 62 includes a plurality of carrier waves having different frequencies in a frequency domain. Further, the carrier wave group generated by the carrier wave group generation unit 62 is represented by an amplitude waveform in which a first peak and a second peck of which absolute value is smaller than that of the first peck alternately appear. The carrier wave group generated by the carrier wave group generation unit 62 will be described in detail later.

Figure 2:
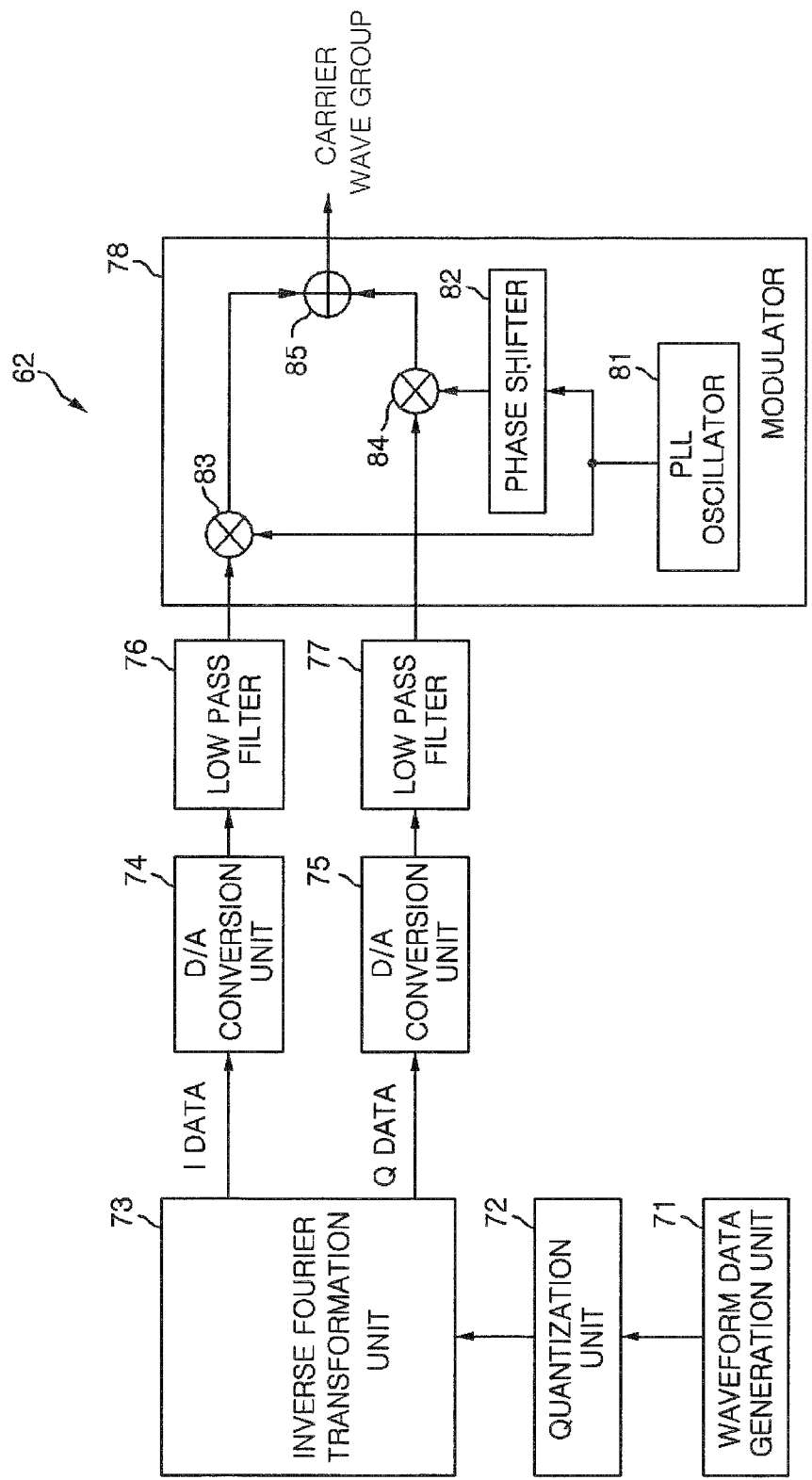
FIG. 2 is a block diagram showing a configuration example of a carrier wave group generation unit in the first embodiment.

FIG. 2 is a block diagram showing a configuration example of the carrier wave group generation unit in the first embodiment. As shown in FIG. 2, the carrier wave group generation unit 62 includes a waveform data generation unit 71, a quantization unit 72, an inverse Fourier transformation unit 73, D (Digital)/A (Analog) conversion units 74 and 75, LPFs (Low Pass Filters) 76 and 77, and a modulator 78.

The waveform data generation unit 71 generates waveform data. The waveform data generation unit 71 acquires parameters (e.g., frequency, phase and the like) for generating the waveform data from, e.g., an input device (not shown), and generates the waveform data by using the acquired parameters. Further, the waveform data generation unit 71 outputs the generated waveform data to the quantization unit 72.

The quantization unit 72 quantizes the waveform data inputted from the waveform data generation unit 71. The inverse Fourier transformation unit 73 performs inverse Fourier transformation of the waveform data quantized by the quantization unit 72, thereby separating I data (In-Phase component) and Q data (Quadrature component) of the waveform data. The I data and the Q data of the waveform data separated by the inverse Fourier transformation unit 73 are D/A converted by the D/A conversion units 74 and 75 and inputted into the modulator 78 through the LPFs 76 and 77.

The modulator 78 modulates reference carrier waves having different phases by 90° by using the I data and the Q data, thereby generating the above-described carrier wave group. Specifically, the modulator 78 includes a PLL (Phase Locked Loop) oscillator 81, a phase shifter 82, multipliers 83 and 84, and an adder 85.

The PLL oscillator 81 generates a reference carrier wave and outputs the generated reference carrier wave to the phase shifter 82 and the multiplier 83. The phase shifter 82 shifts the phase of the reference carrier wave inputted from the PLL oscillator 81 by 90° and outputs the reference carrier wave of which phase has been shifted by 90° to the multiplier 84. The multiplier 83 multiplies the I data inputted from the LPF 76 and the reference carrier wave inputted from the PLL oscillator 81. The multiplier 84 multiplies the Q data inputted from the LPF 77 and the reference carrier wave inputted from the phase shifter 82. The adder 85 adds the multiplication result of the multiplier 83 and that of the multiplier 84, thereby generating a carrier wave group.

Here, an example of a carrier wave group generation process in the carrier wave group generation unit 62 will be described by using equations. The waveform data generated by the waveform data generation unit 71 is an array of digitized codes. A waveform data X(t) at time t is expressed by the following Eq. (1):

$$X(t)=A(t)\cos(\omega t+\theta_0) \quad \text{Eq. (1)}$$

wherein A(t) indicates an amplitude at time t; ω indicates an angular velocity; and $\theta_0$ indicates an initial phase.

By developing the Eq. (1) by using addition theorem, the following Eq. (2) is obtained.

$$X(t)=A(t)\cos\omega t\cdot\cos\theta_0-A(t)\sin\omega t\cdot\sin\theta_0 \quad \text{Eq. (2)}$$

I data I(t) of the waveform data X(t) is expressed by the following Eq. (3). Q data Q(t) of the waveform data X(t) is expressed by the following Eq. (4).

$$I(t)=A(t)\cos\theta_0 \quad \text{Eq. (3)}$$

$$Q(t)=A(t)\sin\theta_0 \quad \text{Eq. (4)}$$

From the above Eqs. (2) to (4), the following Eq. (5) is obtained.

$$X(t)=I(t)\cos\omega t-Q(t)\sin\omega t \quad \text{Eq. (5)}$$

The above Eq. (5) indicates that all the waveform data X(t) are expressed by I data I(t) and Q data Q(t).

In the carrier wave group generation unit 62, first, the waveform data X(t) is quantized by the quantization unit 72, and then inverse-Fourier-transformed by the inverse Fourier transformation unit 73. Accordingly, I data I(t) and Q data Q(t) are separated. Each of I data I(t) and Q data Q(t) are respectively D/A converted by the D/A conversion units 74 and 75 and inputted into the LPFs 76 and through which only low frequency components pass. Two reference carrier waves (cos ωt, −sin ωt) having different phases by 90° are generated from a reference carrier wave (e.g., microwave) of a central frequency fc which is oscillated from the PLL oscillator 81 of the modulator 78. In the modulator 78, the reference carrier waves (cos ωt, −sin ωt) having different phases by 90° are modulated by using I data I(t) and Q data Q(t) outputted from the LPFs 76 and 77. In other words, I data I(t) is multiplied by the reference carrier wave (cos ωt), Q data Q(t) is multiplied by the reference carrier wave (−sin ωt) and then by adding two multiplication results, the carrier wave group is generated.

Referring back to FIG. 1, the amplifier 64 amplifies the carrier wave group generated by the carrier wave group generation unit 62 and supplies the amplified carrier wave group to the lower electrode LE via the matching unit 66. The matching unit 66 matches an output impedance of the carrier wave group generation unit 62 with an input impedance of a load side (the lower electrode LE side). The amplifier 64 needs to have high linearity in order to amplify a waveform in which an amplitude varies without distortion.

Preferably, the amplifier 64 and the matching unit 66 have excellent frequency characteristics and low phase distortion in the frequency band of the disclosure.

In the plasma processing apparatus 10 configured as described above, a gas is introduced into the processing chamber 12 through the gas injection openings 34a of the electrode plate 34 of the upper electrode 30. The carrier wave group generated by the carrier wave group generation unit 62 is supplied to the lower electrode LE via the amplifier 64 and the matching unit 66. When the carrier wave group is supplied to the lower electrode, an electric field is generated in the processing space S between the lower electrode LE and the upper electrode 30. A gas introduced into the processing chamber 12 is turned into a plasma by the electric field generated in the processing space S. Accordingly, the plasma is generated in the processing space S. At this time, the lower electrode LE serves as a plasma generation unit for generating a plasma in the processing chamber 12 by using the carrier wave group.

In the embodiment, the plasma processing apparatus 10 may further include a control unit Cnt. The control unit Cnt is a computer including a processor, a storage unit, an input device, a display device and the like. The control unit Cnt controls the respective components of the plasma processing apparatus 10. In the control unit Cnt, an operator can input commands by using the input device in order to manage the plasma processing apparatus 10. An operation state of the plasma processing apparatus 10 can be visualized and displayed on the display device. The storage unit of the control unit Cnt stores a control program for controlling various processes performed in the plasma processing apparatus 10 under the control of the processor, or a program, i.e., a processing recipe, for allowing the respective components of the plasma processing apparatus 10 to perform processes based on a processing condition.

Figure 3:
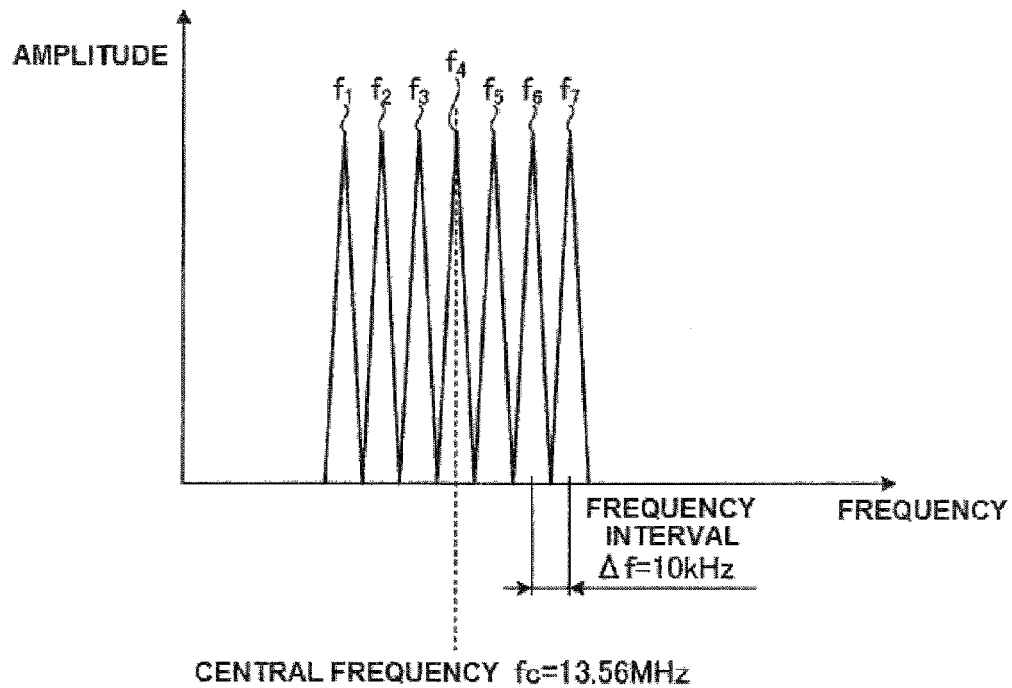
FIG. 3 shows an example of a waveform of a carrier wave group in a frequency domain.
Figure 4:
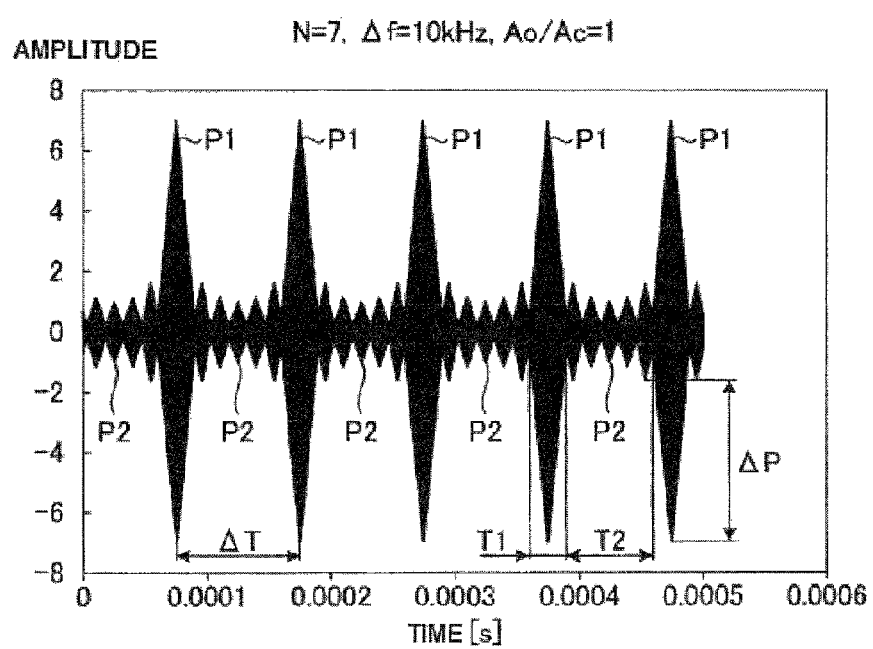
FIG. 4 shows an example of a waveform of a carrier wave group in a time domain.

Hereinafter, the carrier wave group generated by the carrier wave group generation unit 62 will be described in detail with reference to FIGS. 3 to 12. FIG. 3 shows an example of a waveform of a carrier wave group in a frequency domain. FIG. 4 shows an example of a waveform of a carrier wave group in a time domain. In FIG. 3, the horizontal axis represents a frequency, and the vertical axis represents an amplitude. In FIG. 4, the horizontal axis represents time, and the vertical axis represents an amplitude. In FIGS. 3 and 4, it is assumed that the amplitude is normalized.

The carrier wave group shown in FIG. 3 includes a plurality of carrier waves f1 to f7 having different frequencies in a frequency domain. The number N of the carrier waves f1 to f7 is seven. The central frequency fc of the carrier wave group is set to 13.56 MHz. The carrier waves f1 to f7 have the same amplitude value. A frequency interval Δf of the carrier waves f1 to f7 is 10 kHz, and an initial phase of the carrier waves f1 to f7 is set to be shifted by 90° between adjacent carrier waves. A frequency band of the carrier wave group is 13.56 MHz±30 kHz (bandwidth 60 kHz). The waveform of the carrier wave group shown in FIG. 3 is converted to that shown in FIG. 4 in a time domain. In other words, the carrier wave group shown in FIG. 4 is represented by an amplitude waveform in which a first peak P1 and a second peak P2 of which absolute value is smaller than that of the first peak P1 alternately appear in a time domain (hereinafter, appropriately referred to as "amplitude waveform"). Hereinafter, as for the characteristics of the amplitude waveform, (1) the difference ΔP between the first peak P1 and the second peak P2, (2) a ratio of an appearance time T1 of the first peak P1 to the sum of the appearance time T1 of the first peak P1 and an appearance time T2 of the second peak P2, and (3) a time interval ΔT between two adjacent first peaks P1 will be described sequentially.

The difference ΔP between the first peak P1 and the second peak P2 in the amplitude waveform varies depending on a ratio of an amplitude value of a carrier wave corresponding to a central frequency fc of the carrier wave group among the carrier waves f1 to f7 and an amplitude value of a carrier wave other than the carrier wave corresponding to the central frequency fc of the carrier wave group.

Figure 5:
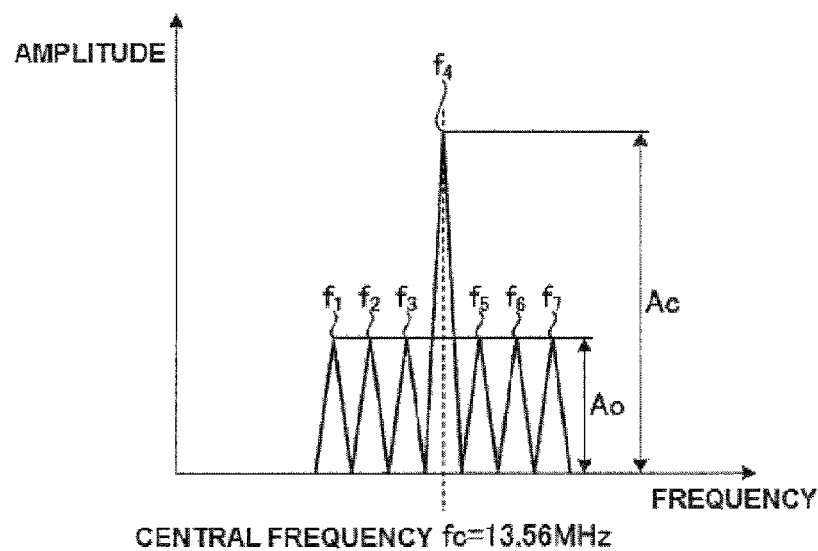
FIG. 5 explains a ratio of an amplitude value of a carrier wave corresponding to a central frequency fc of a carrier wave group to an amplitude value of a carrier wave other than the carrier wave corresponding to the central frequency fc.

FIG. 5 explains the ratio of the amplitude value of the carrier wave corresponding to the central frequency fc of the carrier wave group to the amplitude value of the carrier wave other than the carrier wave corresponding to the central frequency fc of the carrier wave group. As shown in FIG. 5, the ratio Ao/Ac of the amplitude value Ac of the carrier wave f4 corresponding to the central frequency fc of the carrier wave group and the amplitude value Ao of the carrier wave other than the carrier wave f4 corresponding to the central frequency fc of the carrier wave group may vary. For example, the ratio Ao/Ac is changed when the parameters used for generating the waveform data in the waveform data generation unit 71 are changed by an input device (not shown).

Figure 6:
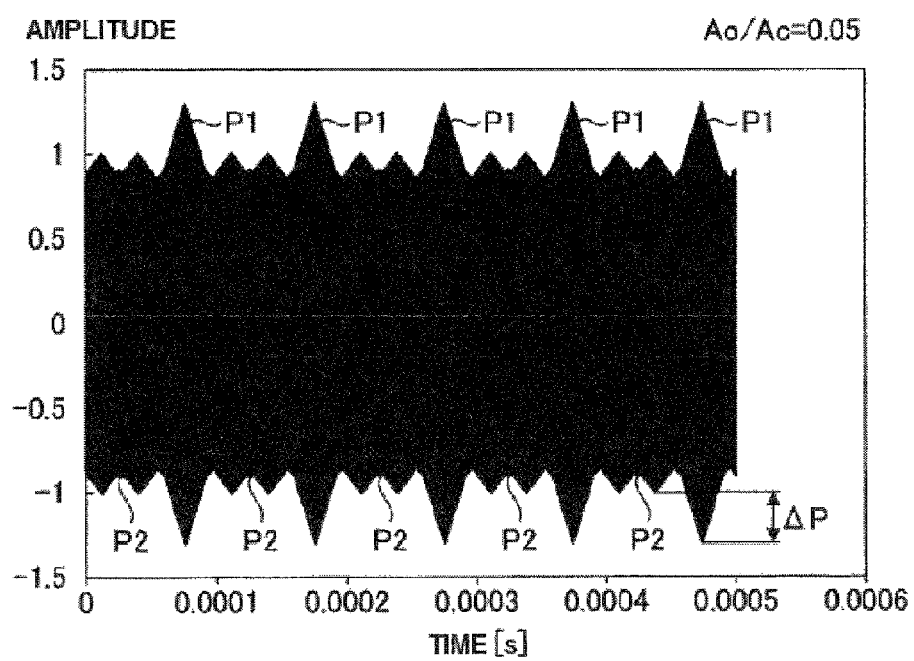
FIGS. 6 to 8 shows variation of a difference $\Delta P$ between a first peak P1 and a second peak P2 with respect to a ratio (Ao/Ac)
Figure 7:
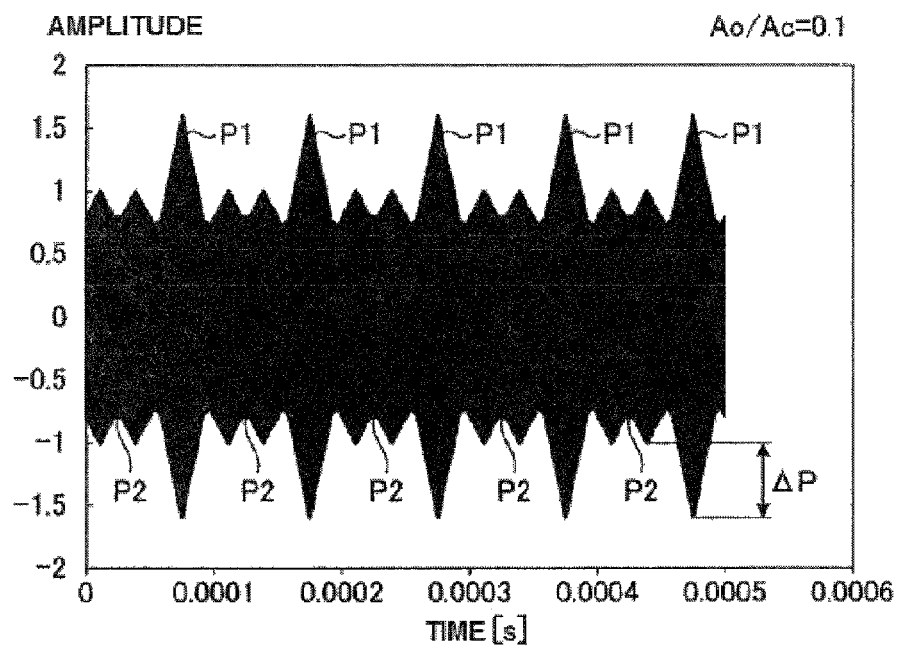
Figure 8:
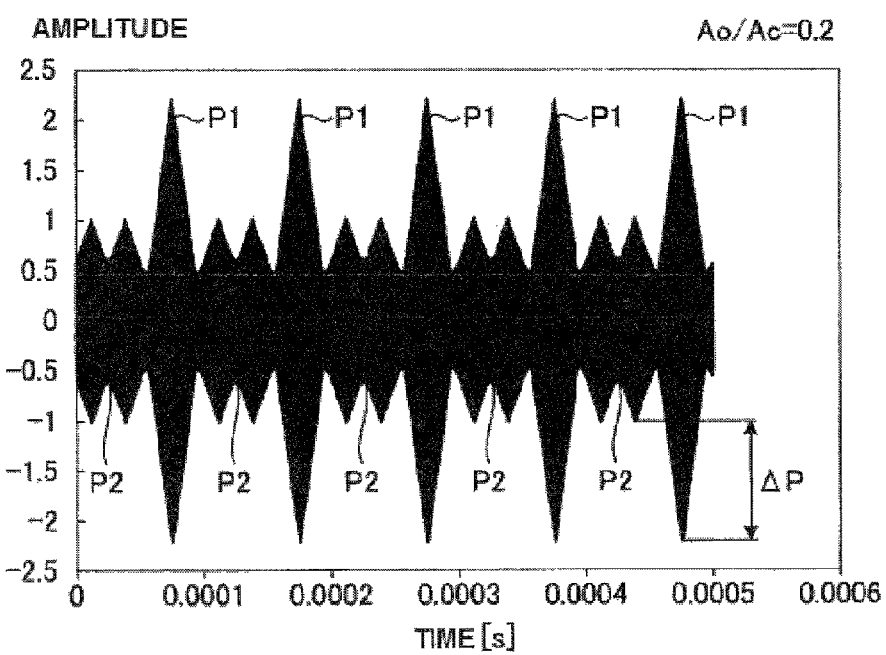

FIGS. 6 to 8 show variation of the difference ΔP between the first peak P1 and the second peak P2 with respect to the ratio Ao/Ac. In FIG. 6, the difference ΔP at the ratio Ao/Ac of 0.05 is illustrated. In FIG. 7, the difference ΔP at the ratio Ao/Ac of 0.1 is illustrated. In FIG. 8, the difference ΔP at the ratio Ao/Ac of 0.2 is illustrated. In FIG. 4, the difference ΔP at the ratio Ao/Ac of 1 is illustrated. As can be seen from FIGS. 4 and 6 to 8, the difference ΔP between the first peak P1 and the second peak P2 in the amplitude waveform is increased as the ratio Ao/Ac is increased.

The ratio of the appearance time T1 of the first peak P1 to the sum of the appearance time T1 of the first peak P1 and the appearance time T2 of the second peak P2 in the amplitude waveform varies depending on the number N of the carrier waves f1 to f7. Hereinafter, the ratio of the appearance time T1 of the first peak P1 to the sum of the appearance time T1 of the first peak P1 and the appearance time T2 of the second peak P2 in the amplitude waveform will be referred to as "duty ratio of the first peak P1". The number N of the carrier waves f1 to f7 is changed, e.g., when the parameters used for generating the waveform in the waveform data generation unit 71 are changed by the input device (not shown).

Figure 9:
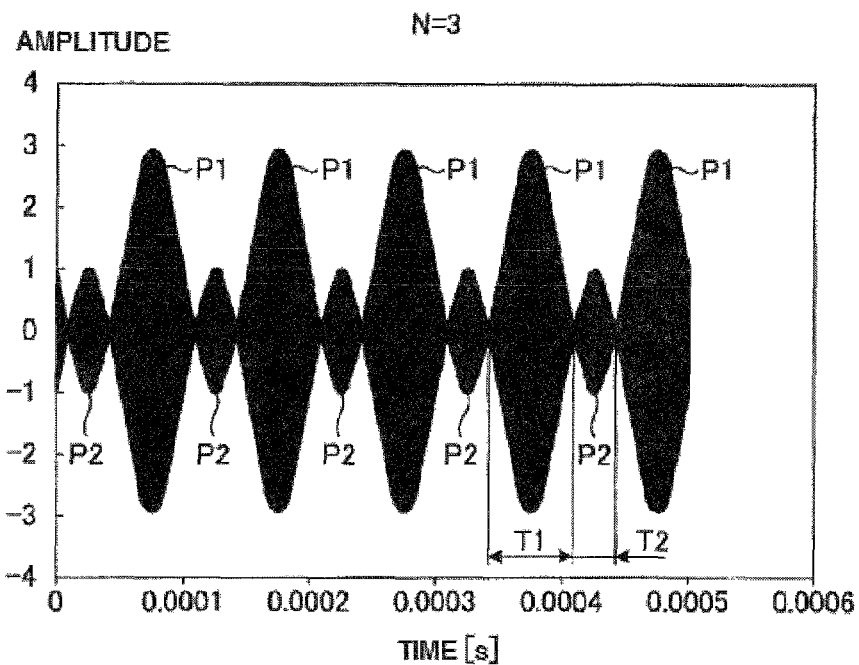
FIGS. 9 and 10 show variation of a duty ratio of the first peak P1 with respect to the number N.
Figure 10:
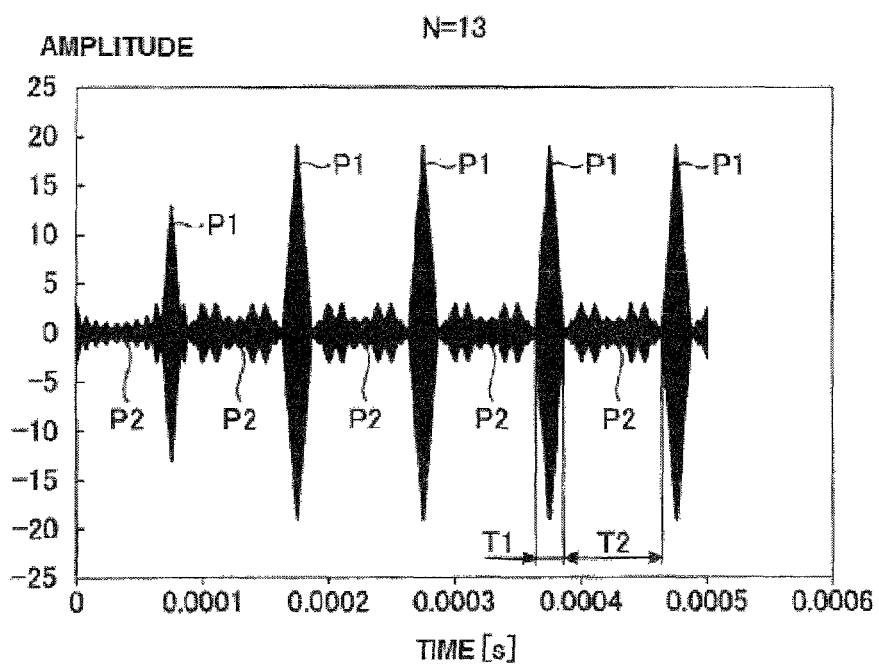

FIGS. 9 and 10 show variation of the duty ratio of the first peak P1 with respect to the number N. In FIG. 9, the appearance time T1 of the first peak P1 and the appearance time T2 of the second peak P2 at the number N of 3 are illustrated. In FIG. 10, the appearance time T1 of the first peak P1 and the appearance time T2 of the second peak P2 at the number N of 13 are illustrated. In FIG. 4, the appearance time T1 of the first peak P1 and the appearance time T2 of the second peak P2 at the number N of 7 are illustrated. As can be seen from FIGS. 4, 9 and 10, the appearance time T1 of the first peak P1 in the amplitude waveform is decreased as the number N is increased, whereas the appearance time T2 of the second peak P2 in the amplitude waveform is increased as the number N is increased. In other words, the duty ratio of the first peak P1 is decreased as the number N is increased.

The time interval ΔT between two adjacent first peaks P1 in the amplitude waveform varies depending on the frequency interval Δf of the carrier waves f1 to f7. For example, the frequency interval Δf of the carrier waves f1 to f7 is changed when the parameters used for generating the waveform data in the waveform data generation unit 71 are changed by the input device (not shown).

Figure 11:
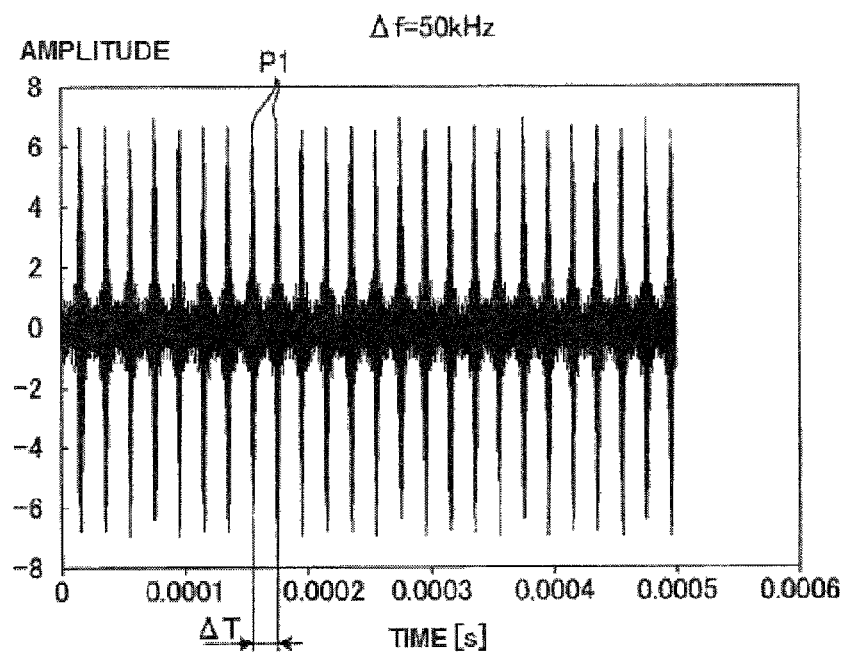
FIGS. 11 and 12 show variation of a time interval $\Delta T$ between two adjacent first peaks P1 with respect to a frequency interval $\Delta f$.
Figure 12:
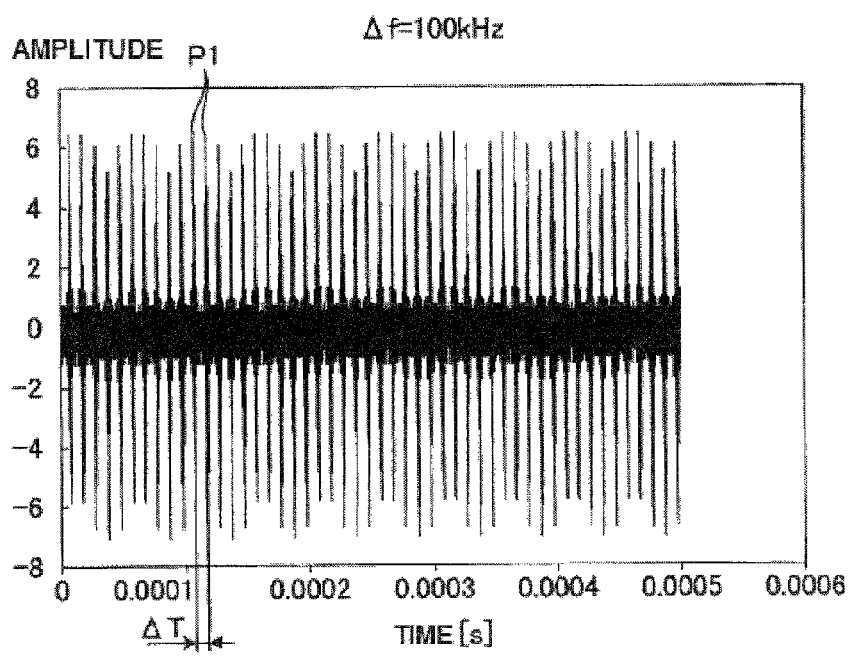

FIGS. 11 and 12 show variation of the time interval ΔT between two adjacent first peaks P1 with respect to the frequency interval Δf. In FIG. 11, the time interval ΔT between two adjacent first peaks P1 at the frequency interval Δf of 50 kHz is illustrated. In FIG. 12, the time interval ΔT between two adjacent first peaks P1 at the frequency interval Δf of 100 kHz is illustrated. In FIG. 4, the time interval ΔT between two adjacent first peaks P1 at the frequency interval Δf of 10 kHz is illustrated. As can be seen from FIGS. 4, 11 and 12, the time interval ΔT between two adjacent first peaks P1 in the amplitude waveform is decreased as the frequency interval Δf of the carrier waves f1 to f7 is increased.

Figure 13:
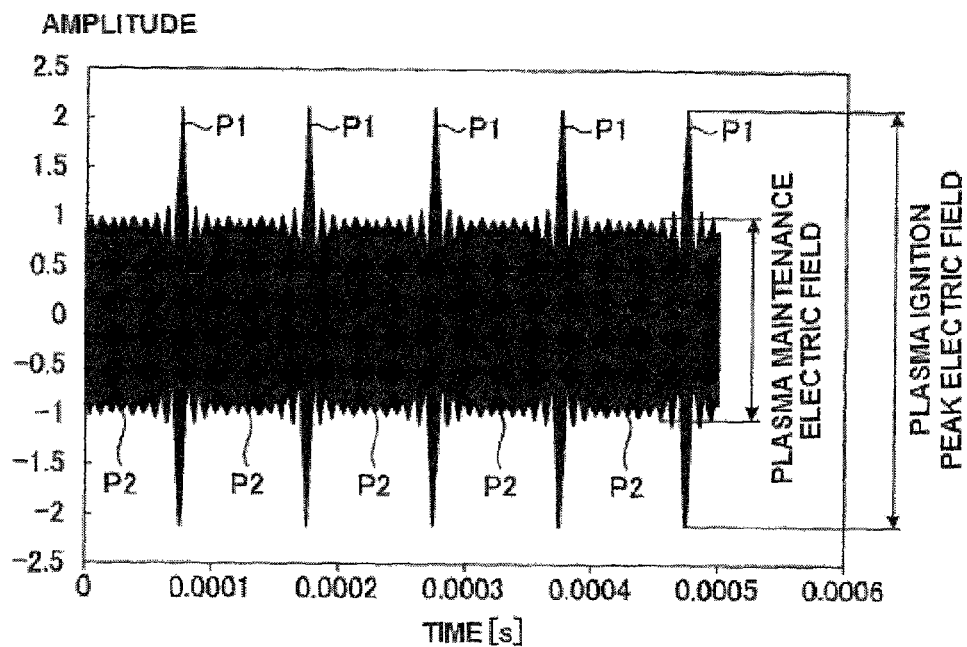
FIG. 13 explains an operation of the carrier wave group.

FIG. 13 explains an operation of the carrier wave group. As can be seen from FIG. 13, the first peak P1 and the second peak P2 of which absolute value is smaller than that of the first peak P1 alternately appear in the amplitude waveform of the carrier wave group generated by the carrier wave group generation unit 62. Due to the appearance of the first peak P1, a plasma ignition peak electric field is generated in the processing chamber 12. The plasma ignition peak electric field causes discharge for plasma generation (ignition). When the plasma ignition peak electric field is generated in the processing chamber 12, ionization in the plasma by the discharge is accelerated and, thus, plasma density is instantaneously increased. On the other hand, due to the appearance of the second peak P2, a plasma maintenance electric field is generated in the processing chamber 12. The plasma maintenance electric field causes discharge for maintaining a plasma. An absolute value of the plasma maintenance electric field is smaller than that of the plasma ignition peak electric field. When the plasma maintenance electric field is generated in the processing chamber 12, the ionization in the plasma by the discharge is suppressed and, thus, the increase in the plasma density is suppressed. The carrier wave group generated by the carrier wave group generation unit 62 generates the plasma ignition peak electric field and the plasma maintenance electric field alternately in the processing chamber 12. Accordingly, an excessive increase in plasma density is prevented and the electric field that is enough to maintain a plasma is ensured.

Figure 14:
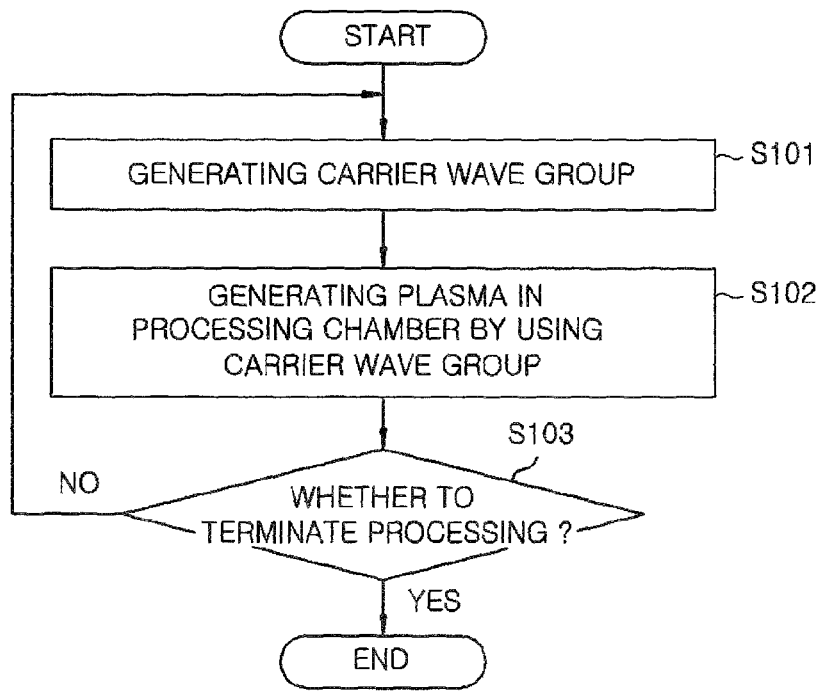
FIG. 14 is a flowchart showing a plasma processing method according to the first embodiment.

Next, a plasma processing method using the plasma processing apparatus 10 according to the first embodiment will be described with reference to FIG. 14. FIG. 14 is a flowchart of the plasma processing method according to the first embodiment.

As shown in FIG. 14, the carrier wave group generation unit 62 of the plasma processing apparatus 10 generates a carrier wave group (step S101). The carrier wave group generated by the carrier wave group generation unit 62 includes a plurality of carrier waves having different frequencies in a frequency domain. Further, the carrier wave group generated by the carrier wave group generation unit 62 is represented by an amplitude waveform in which a first peak and a second peak of which absolute value is smaller than that of the first peak alternately appear in a time domain.

The lower electrode LE generates a plasma in the processing chamber 12 by using the carrier wave group (step S102).

It is determined whether to terminate the processing (step S103). The plasma processing apparatus 10 returns the processing to the step S101 when NO is selected in the step S103 or terminates the processing when YES is selected in the step S103.

In the plasma processing apparatus 10 according to the first embodiment, the carrier wave group represented by the amplitude waveform in which the first peak and the second peak alternately appear in the time domain is generated, and the plasma is generated in the processing chamber 12 by using the carrier wave group thus generated. Therefore, the plasma ignition peak electric field and the plasma maintenance electric field can be alternately generated in the processing chamber 12. Accordingly, an excessive increased in the plasma density can be prevented and the electric field that is enough to maintain the plasma is ensured. As a result, the plasma can be stably maintained under an environment of a low pressure and at a low plasma density. In addition, controllability of the ion energy distribution can be improved.

Figure 15:
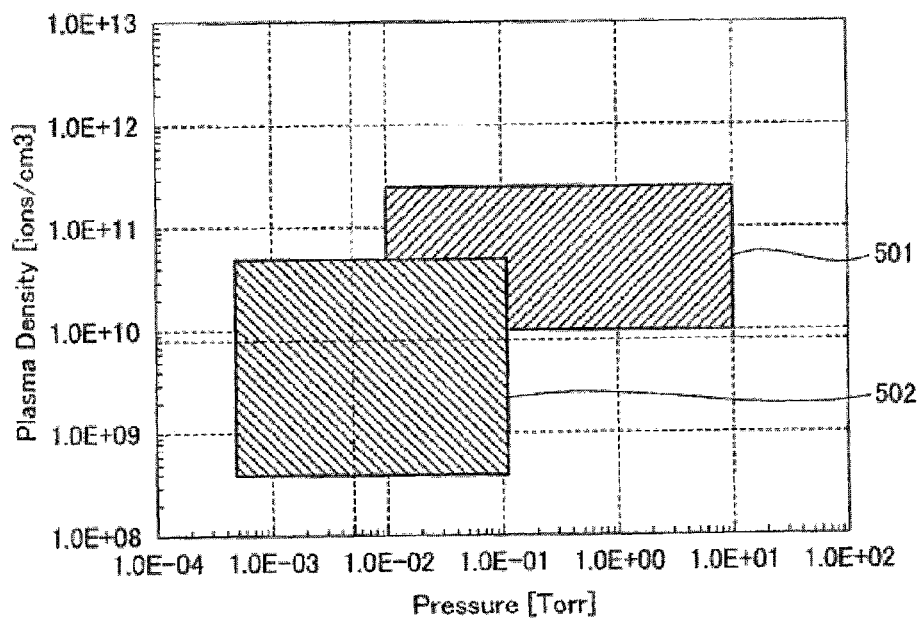
FIG. 15 explains an effect (maintaining a plasma) of a plasma processing apparatus according to the first embodiment.

Next, the effect (maintaining the plasma) of the plasma processing apparatus 10 according to the first embodiment will be described with reference to FIG. 15. FIG. 15 explains the effect (maintaining the plasma) of the plasma processing apparatus according to the first embodiment. In FIG. 15, the horizontal axis represents a pressure (Torr), and the vertical axis represents a plasma density (ions/cm$^3$). Further, in FIG. 15, a region 501 indicates a region where the plasma is maintained in the case of employing a conventional plasma processing apparatus using a high frequency power generated by a high frequency power supply. Moreover, in FIG. 15, a region 502 indicates a region where the plasma is maintained in the case of employing the plasma processing apparatus 10 of the first embodiment.

As shown in FIG. 15, in the conventional plasma processing apparatus, the plasma was maintained only under the environment in which the pressure was 5 mTorr or above and the plasma density was 1E+10 ions/cm$^3$ or above. On the other hand, in the plasma processing apparatus 10 of the first embodiment, the plasma was maintained even under the environment in which the pressure was lower than 5 mTorr and the plasma density was lower than 1E+10 ions/cm$^3$. In other words, compared with the conventional plasma processing apparatus, the plasma can be stably maintained at a low pressure and at a low plasma density in the plasma processing apparatus 10 of the first embodiment.

Figure 16:
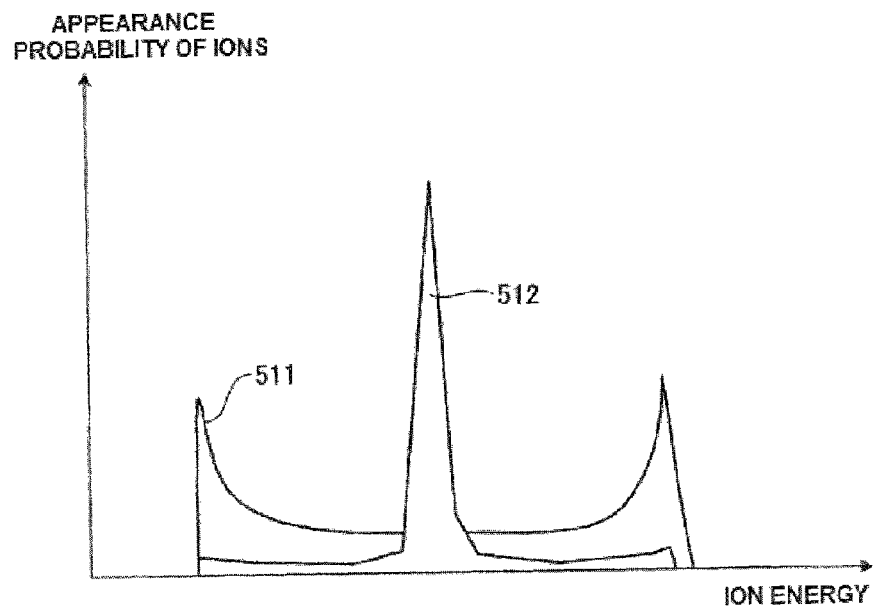
FIG. 16 explains an effect (ion energy distribution) of the plasma processing apparatus according to the first embodiment.

Next, the effect (ion energy distribution) of the plasma processing apparatus 10 of the first embodiment will be described with reference to FIG. 16. FIG. 16 explains the effect (ion energy distribution) of the plasma processing apparatus of the first embodiment. In FIG. 16, the horizontal axis represents energy of ions incident on the wafer W (hereinafter, referred to as "ion energy"), and the vertical axis represents an appearance probability of ions incident on the wafer W. In FIG. 16, a graph 511 shows ion energy distribution in the case of employing the conventional plasma processing apparatus using a high frequency power generated by the high frequency power supply. Further, in FIG. 16, a graph 512 shows ion energy distribution in the case of employing the plasma processing apparatus 10 of the first embodiment.

As can be seen from FIG. 16, in the conventional plasma processing apparatus, the peaks of the ion appearance probability were distributed to near the minimum value and the maximum value of the ion energy. On the other hand, in the plasma processing apparatus 10 of the first embodiment, the peak of the ion appearance probability was concentrated near a specific ion energy. In other words, in the plasma processing apparatus 10 of the first embodiment, the controllability of the distribution of ion energy can be improved as compared with the conventional plasma processing apparatus.

As described above, in the plasma processing apparatus of the first embodiment, the carrier wave group represented by the amplitude waveform in which the first peak and the second peak alternately appear in the time domain is generated, and the plasma is generated in the processing chamber 12 by using the carrier wave group thus generated. Therefore, the plasma ignition electric field and the plasma maintenance electric field can be alternately generated in the processing chamber 12. Accordingly, an excessive increase in the plasma density can be prevented and the electric field that is enough to maintain the plasma is ensured. As a result, the plasma can be stably maintained at a low pressure and at a low plasma density. In addition, the controllability of the ion energy distribution can be improved.

The disclosure is not limited to the above embodiments and may be variously modified within the scope of the gist of the disclosure.

Figure 17:
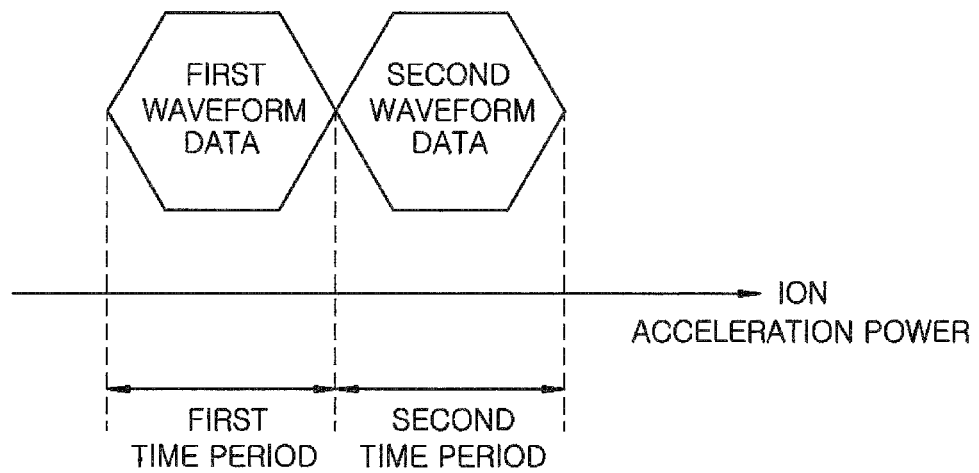
FIGS. 17 and 18 explain a modification 1.
Figure 18:
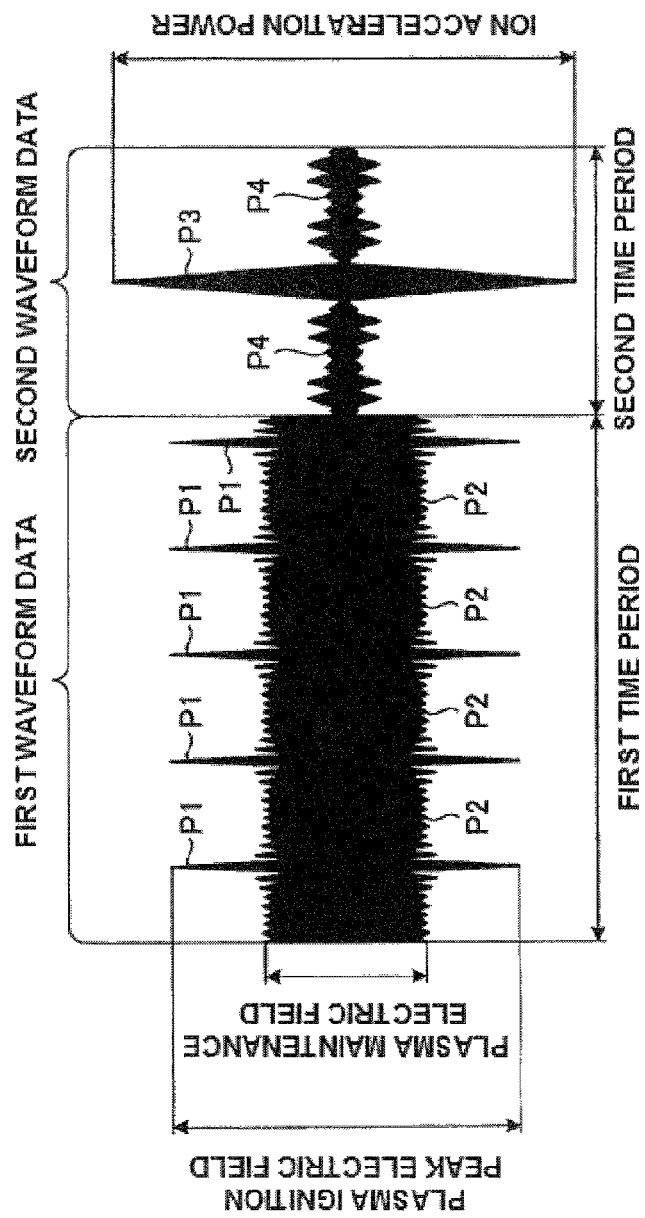

In the above embodiments, there has been described an example in which a single waveform data is generated by the waveform data generation unit 71 and a carrier group wave is generated based on the single waveform data by the modulator 78. However, the disclosure is not limited thereto. FIGS. 17 and 18 explain a modification 1. For example, as shown in FIG. 17, the waveform data generation unit 71 may generate a first waveform data during a first time period and a second waveform data different from the first waveform data during a second time period after the first time period. In that case, as shown in FIG. 18, the modulator 78 generates a carrier wave group based on the first waveform data during the first time period and generates a carrier wave group based on the second waveform data during the second time period. In the example shown in FIG. 18, the carrier wave group generated based on the first waveform data is represented by an amplitude waveform in which the first peak P1 and the second peak P2 of which absolute value is smaller than that of the first peak P1 alternately appear in the time domain. Therefore, during the first time period, the plasma ignition peak electric field is generated in the processing chamber 12 by the appearance of the first peak P1, and the plasma maintenance electric field is generated in the processing chamber 12 by the appearance of the second peak P2. On the other hand, the carrier wave group generated based on the second waveform data is represented by an amplitude waveform in which a third peak P3 and a fourth peak P4 of which absolute value is smaller than that of the third peak P3 alternately appear in the time domain. The absolute value of the third peak P3 is greater than that of the first peak P1. Accordingly, during the second time period, an ion acceleration power for accelerating ions incident on the wafer W is applied to the lower electrode LE by the appearance of the third peak P3.

Figure 19:
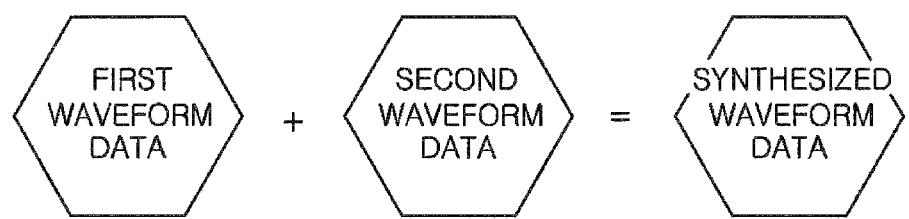
FIGS. 19 and 20 explain a modification 2.
Figure 20:
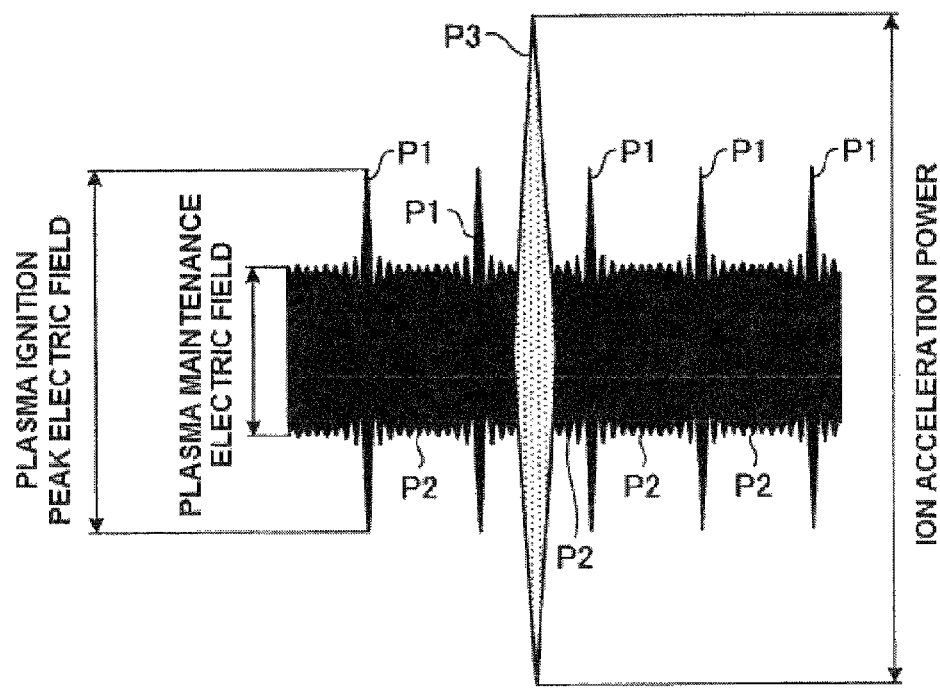

FIGS. 19 and 20 explain a modification 2. For example, as shown in FIG. 19, the waveform data generation unit 71 may generate, as the waveform data, a synthesized waveform data obtained by combining a first waveform data and a second waveform data different from the first waveform data. In that case, as shown in FIG. 20, the modulator 78 generates, based on the synthesized waveform data, a carrier wave group in which a first peak P1 and a second peak P2 of which absolute value is smaller than that of the first peak P1 alternately appear and a third peak P3 appears at an arbitrary time. The absolute value of the third peak P3 is greater than that of the first peak P1. In the example shown in FIG. 20, the plasma ignition peak electric field is generated in the processing chamber 12 by the appearance of the first peak P1, and the plasma maintenance electric field is generated in the processing chamber 12 by the appearance of the second peak P2. Further, the ion acceleration power for accelerating ions incident on the wafer W is applied to the lower electrode LE by the appearance of the third peak P3.

In the above embodiments, there have been described examples in which the carrier wave group generated by the carrier wave group generation unit 62 is supplied to the lower electrode LE. However, the disclosure is not limited thereto. For example, the carrier wave group may be applied to the upper electrode 30. When the carrier wave group is supplied to the upper electrode 30, an electric field is generated in the processing space S between the lower electrode LE and the upper electrode 30. A gas introduced into the processing chamber 12 is turned into a plasma by the electric field generated in the processing space S. As a consequence, the plasma is generated in the processing space S. At this time, the upper electrode 30 serves as a plasma generation unit for generating a plasma in the processing chamber 12 by using the carrier wave group.

Second Embodiment

Figure 21:
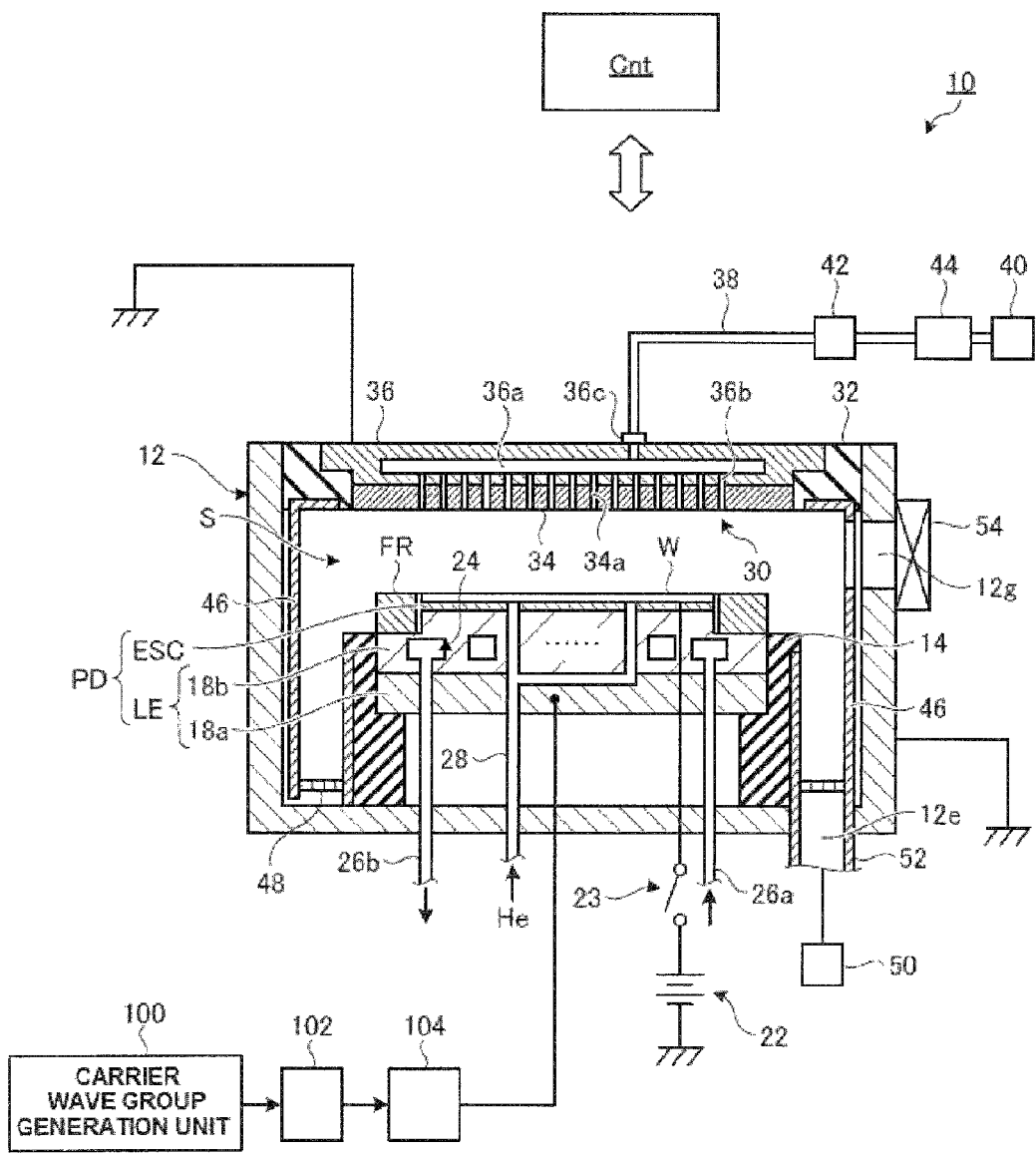
FIG. 21 shows a plasma processing apparatus according to a second embodiment.

Hereinafter, a second embodiment will be described. FIG. 21 shows a plasma processing apparatus according to the second embodiment. A plasma processing apparatus 10 according to the second embodiment has substantially the same configuration as that of the plasma processing apparatus 10 according to the first embodiment shown in FIG. 1. Therefore, like reference numerals will be used for like parts and redundant description thereof will be omitted. Hereinafter, the differences will be mainly described.

The plasma processing apparatus 10 according to the second embodiment includes a carrier wave group generation unit 100, a directional coupler 102 and a matching unit 104, instead of the carrier wave group generation unit 62, the amplifier 64 and the matching unit 66.

The carrier wave group generation unit 100 generates a carrier wave group. For example, the carrier wave group generation unit 100 generates a carrier wave group in which a plurality of electrical signals having different frequencies is combined. The carrier wave group generated by the carrier wave group generation unit 100 includes a plurality of carrier wave groups having different frequencies in a frequency domain. Further, the carrier wave group generated by the carrier wave group generation unit 100 is represented by an amplitude waveform in which a first peak and a second peak of which absolute value is smaller than an absolute value of the first peak alternately appear in a time domain. The carrier wave group generated by the carrier wave group generation unit 100 will be described in detail later.

Figure 22:
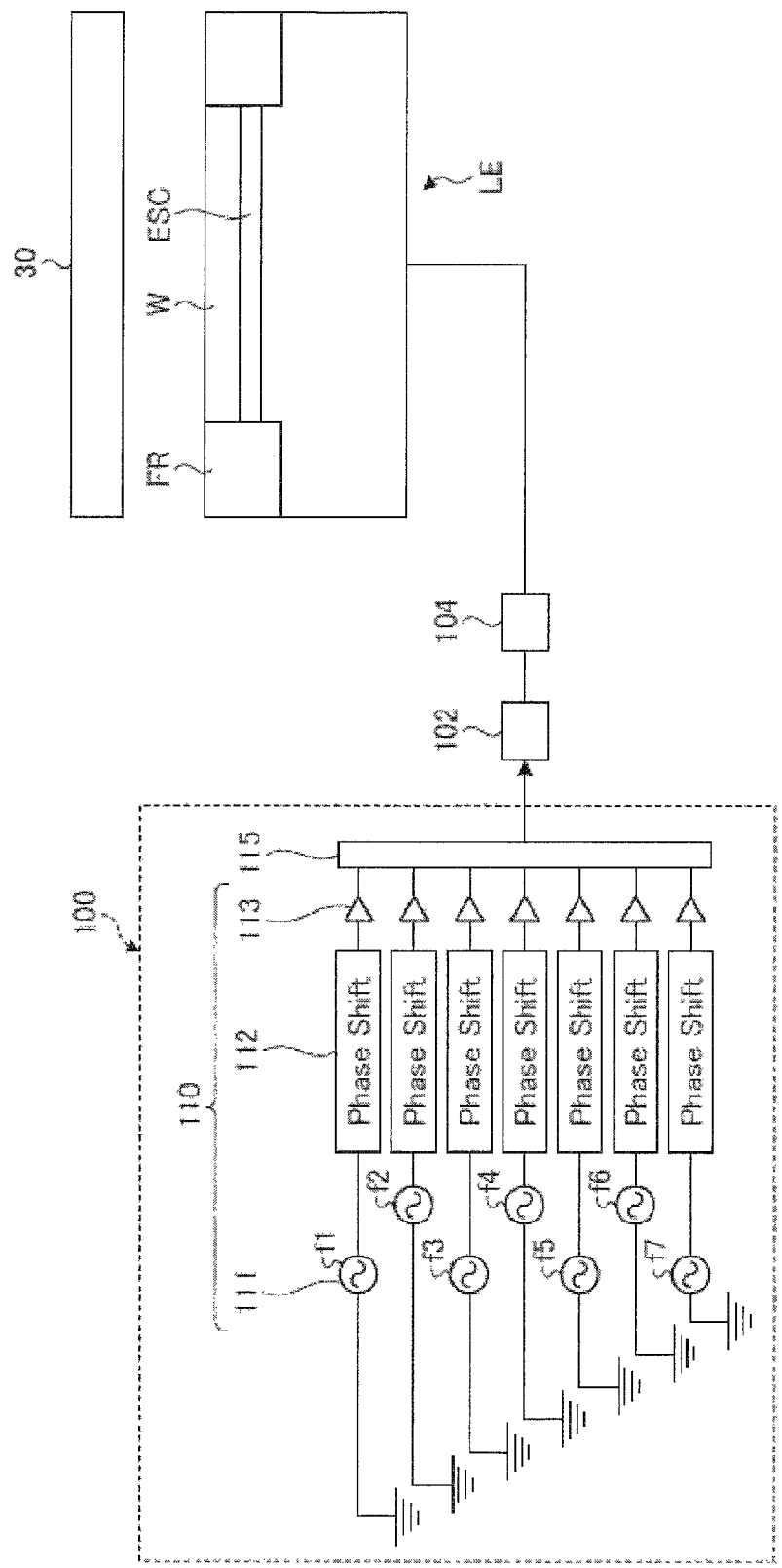
FIG. 22 shows a carrier wave group generation unit in the second embodiment.

FIG. 22 shows the carrier wave group generation unit in the second embodiment. As shown in FIG. 22, the carrier wave group generation unit 100 includes a plurality of generation circuits 110 for generating electrical signals of carrier waves. For example, in the example shown in FIG. 22, the carrier wave group generation unit 100 includes seven generation circuits 110 arranged in parallel. The number of the generation circuits 110 is not limited to seven. The carrier wave group generation unit 100 generates a carrier wave group under the control of the control unit Cnt. For example, the carrier wave group generation unit 100 acquires parameters (e.g., frequency, phase, amplification factor of amplitude and the like) for specifying carrier waves generated by the respective generation circuits 110 from the control unit Cnt and generates a carrier wave group by using the acquired parameters.

Each of the generation circuits 110 includes a signal generator 111, a phase shifter 112 and a power amplifier 113.

The signal generator 111 is connected to the phase shifter 112. Further, the signal generator 111 is grounded. The signal generator 111 generates an electrical signal of a carrier wave. For example, the signal generator 11 generates a signal of a frequency specified by each of the parameters. The signal generator 111 outputs the generated electrical signal to the phase shifter 112. The phase shifter 112 is connected to the power amplifier 113. The phase shifter 112 shifts a phase of the inputted electrical signal of the carrier wave. For example, the phase shifter 112 shifts a phase of the inputted electrical signal of the carrier wave by an amount specified by the parameter and outputs the phase-shifted electrical signal to the power amplifier 113. The power amplifier 113 amplifies the inputted electrical signal of the carrier wave by an amplification factor specified by the parameter and outputs the amplified electrical signal.

The carrier wave group generation unit 100 further includes an output combiner 115. The power amplifiers 113 of the respective generation circuits 110 are connected to the output combiner 115. The electrical signals of the carrier waves amplified by the respective power amplifiers 113 are inputted into the output combiner 115. The output combiner 115 generates a carrier wave group by combining the electrical signals of the carrier waves which have been amplified by the respective power amplifiers 113. The output combiner 115 outputs an electrical signal of the generated carrier wave group to the directional coupler 102.

The directional coupler 102 outputs the inputted electrical signal of the carrier wave group to the matching unit 104. Further, the directional coupler 102 may be connected to a detection unit (not shown) for detecting a level or a waveform of the electrical signal flowing from the directional coupler 102 toward the matching unit 104. The detection result may be notified to the control unit Cnt. The control unit Cnt may control the parameters for specifying the carrier waves generated by the respective generation circuits 110 based on the notified detection result such that the carrier wave group becomes in a desired state.

The matching unit 104 supplies the inputted electrical signal of the carrier wave group to the lower electrode LE. The matching unit 104 matches an output impedance of the carrier wave group generation unit 100 side with an input impedance of a load side (lower electrode LE side). The matching unit 104 is preferably of a wideband type corresponding to a frequency band of the carrier wave group passing therethrough. The power amplifier 113 needs to have high linearity in order to amplify a waveform in which an amplitude varies without distortion. Preferably, the phase shifter 112, the directional coupler 102 and the matching unit 104 have excellent frequency characteristics and low phase distortion in the frequency band of the disclosure.

Figure 23:
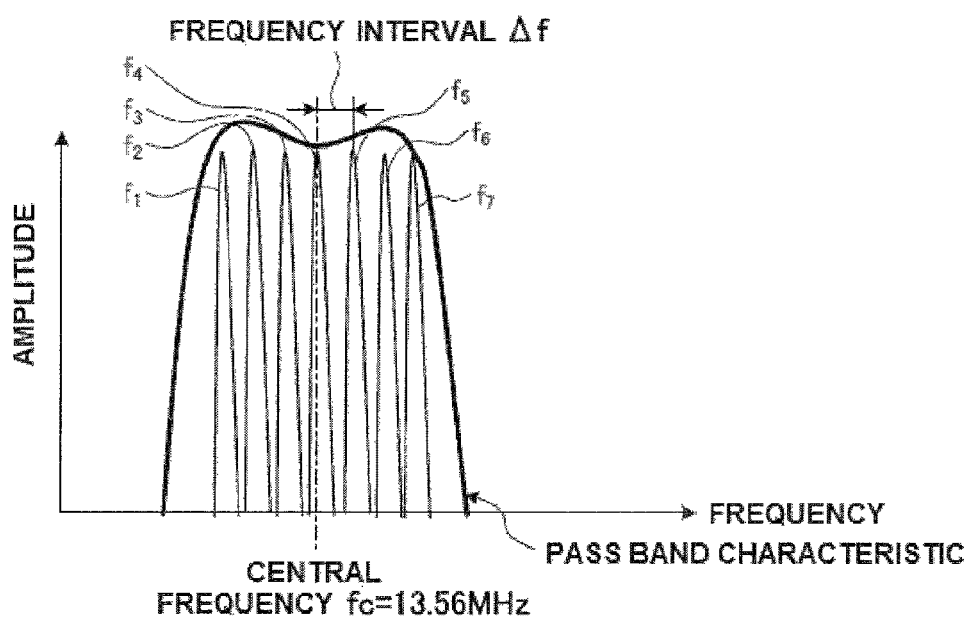
FIG. 23 shows examples of frequencies of carrier waves generated by generation circuits.

Here, an example of a carrier wave group generation process in the carrier wave group generation unit 100 will be described. In the carrier wave group generation unit 100, carrier waves having different frequencies at a predetermined frequency interval Δf are generated by the respective generation circuits 110. FIG. 23 shows examples of frequencies of carrier waves generated by the respective generation circuits. In FIG. 23, the horizontal axis represents a frequency and the vertical axis represents an amplitude. The amplitude indicates a level of a power supplied by a carrier wave. In FIG. 23, there are illustrated seven carrier waves f1 to f7 having a frequency interval Δf with respect to the central frequency fc of 13.56 MHz. The respective generation circuits 110 generate the carrier waves f1 to f7 having the respective frequencies shown in FIG. 23. The number N of the generated carrier waves is not limited to seven, and may be any number smaller than or equal to the number of the generation circuits 110 as long as it is plural. The variation of the carrier wave group which is caused by the variation of the number N of the carrier waves and the variation of the frequency interval Δf will be described later.

The phase shifters 112 shift the phases of the inputted electrical signals of the carrier waves. For example, each of the phase shifters 112 sequentially shifts the phase of the inputted electrical signal of the carrier wave by a predetermined cycle with respect to an electrical signal of a carrier wave having a frequency adjacent thereto and outputs the phase-shifted electrical signal to the power amplifier 113. The predetermined cycle is preferably set to a phase corresponding to a cycle obtained by dividing a phase of one cycle by an integer. In the present embodiment, the shift cycle is set to, e.g., 90°. Each of the phase shifters 112 shifts the inputted electrical signal of the carrier wave by 90° with respect to a carrier wave adjacent to a lower frequency and outputs the phase-shifted electrical signal to the power amplifier 113. For example, when the phase of the carrier wave f1 is set to 0°, the phase of the carrier wave f2 is shifted by 90°. The phase of the carrier wave f3 is shifted by 180°. The phase of the carrier wave f4 is shifted by 270°. The phase of the carrier wave f5 is shifted by 0°. The phase of the carrier wave f6 is shifted by 90°. The phase of the carrier wave f7 is shifted by 0°. When the phase of the electrical signal is shifted by the amplification of the power amplifier 113, each of the phase shifters 112 may shift the phase such that the shift amount becomes a predetermined cycle while considering the shift amount of the phase in the power amplifier 113 after the amplification of the power amplifier 113. For example, the shift amount of the phase in the power amplifier 113 is stored in advance as correction information in a storage unit of the control unit Cnt, and the control unit Cnt may specify the shift of the phase by the amount except the shift amount of the phase in the power amplifier 113 for each of the phase shifters 112 by using the correction information and allow each of the phase shifters 112 to shift the phase by the amount except the shift amount in the power amplifier 113.

Figure 24:
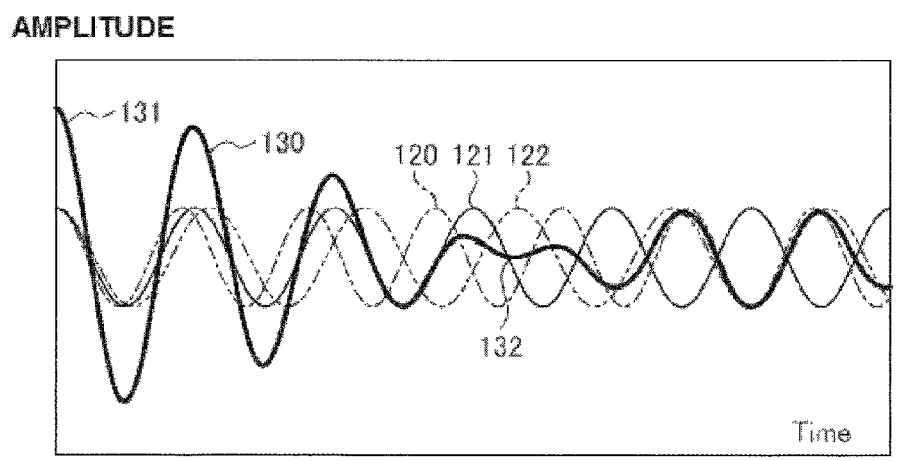
FIG. 24 shows an example of combination of the carrier waves.

The output combiner 115 combines the electrical signals of the carrier waves amplified by the respective power amplifiers 113. FIG. 24 shows an example of combination of the carrier waves. In FIG. 24, the case of combining three carrier waves 120, 121 and 122 is illustrated in order to simplify the description. In FIG. 24, the horizontal axis represents time and the vertical axis represents an amplitude. In FIG. 24, a composite wave 130 in which the carrier waves 120 to 122 having different frequencies at a frequency interval Δf are combined with the carrier waves 120 to 122 is illustrated. The amplitude of the composite wave 130 is increased at portions where the peaks of the amplitudes of the carrier waves 120 to 122 in the same direction are overlapped by the resonance of the carrier waves 120 to 122. For example, the amplitude of the composite wave 130 is greater than the amplitudes of the carrier waves 120 to 122 at a peak portion 131. Further, the amplitude of the composite wave 130 is decreased at portions where small amplitudes of the carrier waves 120 to 122 are overlapped or where amplitudes of the carrier waves 120 to 122 in different directions are overlapped. For example, the amplitude of the composite wave 130 is smaller than the amplitudes of the carrier waves 120 to 122 at a peak portion 132.

A maximum peak of the composite wave 130 is increased as the number N of the combined carrier waves is increased.

Further, a cycle in which the maximum peak of the composite wave 130 appears varies by varying the frequency interval Δf.

Figure 25:
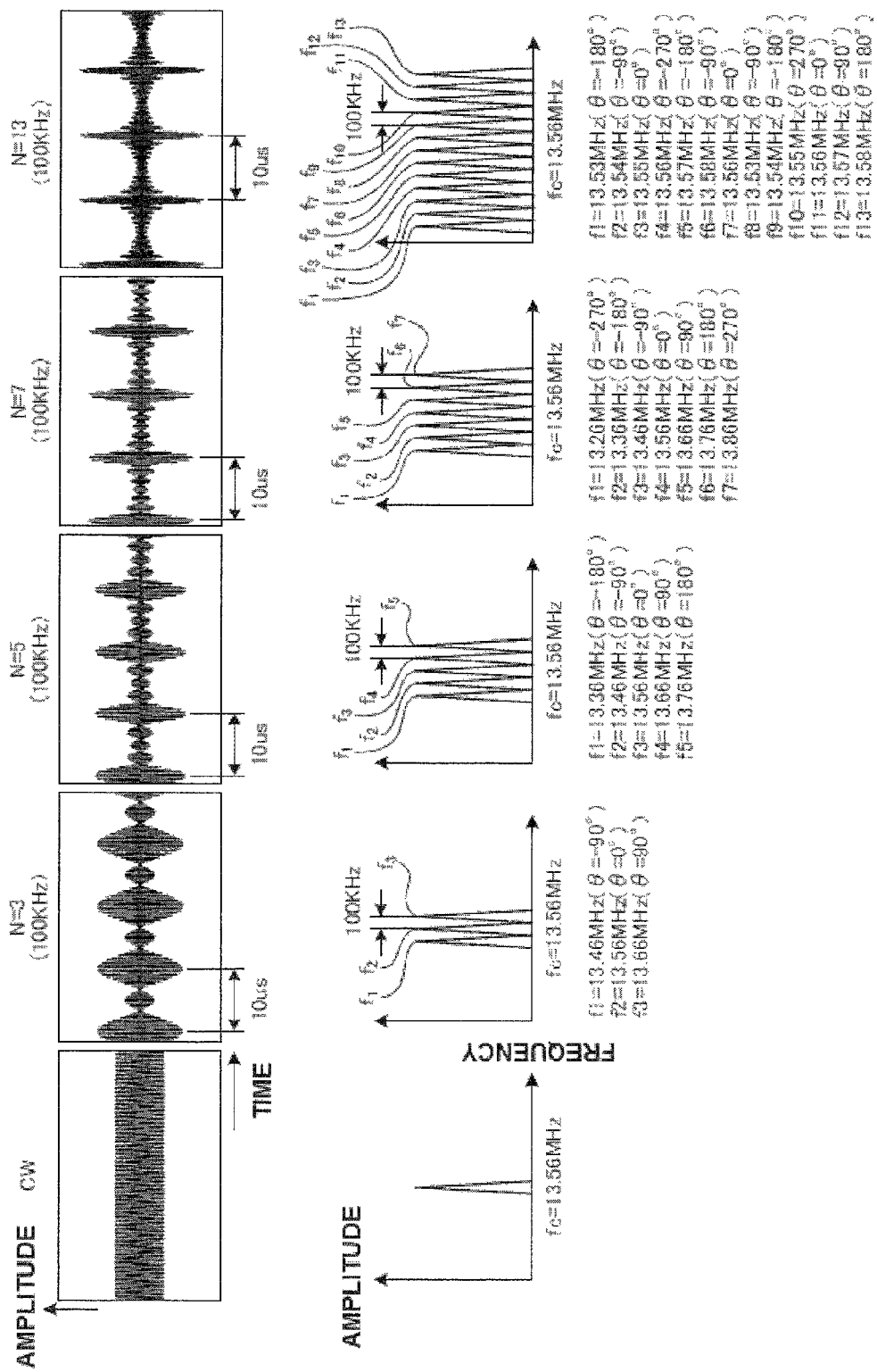
FIG. 25 shows examples of waveforms of electrical signals of a carrier wave group on the basis of the number N of the carrier waves.

Here, the variation of the waveform of the electrical signal of the carrier wave group by the combined carrier waves will be described. First, the variation of the waveform of the electrical signal of the carrier wave group by the variation of the number N of the carrier waves will be described. FIG. 25 shows examples of the waveforms of the electrical signals of the carrier wave group on the basis of the number N of the carrier waves. The examples in FIG. 25 show the case of setting the central frequency fc to 13.56 MHz and the frequency interval Δf to 100 KHZ and varying the number N of the carrier waves. Graphs in the lower side of FIG. 25 shows frequencies and amplitudes of the carrier waves f in the case of setting the number N to 1(CW), 3, 5, 7 and 13. In the graphs in the lower side of FIG. 25, the horizontal axis represents a frequency and the vertical axis represents an amplitude. The frequencies and the phases of the respective carrier waves f are shown below the respective graphs. In the upper side of FIG. 25, waveforms of the electrical signals of the carrier wave group in which the carrier waves f shown in the lower side are combined are illustrated. In the graphs in the upper side of FIG. 25, the horizontal axis represents time and the vertical axis represents an amplitude.

There is no resonance in the waveform obtained when the number N is 1 (CW) because only a carrier wave having a frequency fc exists. Therefore, the resonance does not occur. On the other hand, the waveforms obtained when the number N is 3, 5, 7 and 13 have peaks having large amplitudes and peaks having small amplitudes in a time domain due to the resonance of the carrier waves. A cycle in which the peaks having large amplitudes occur is 100 KHZ which is the same as the frequency interval Δf.

Figure 26:
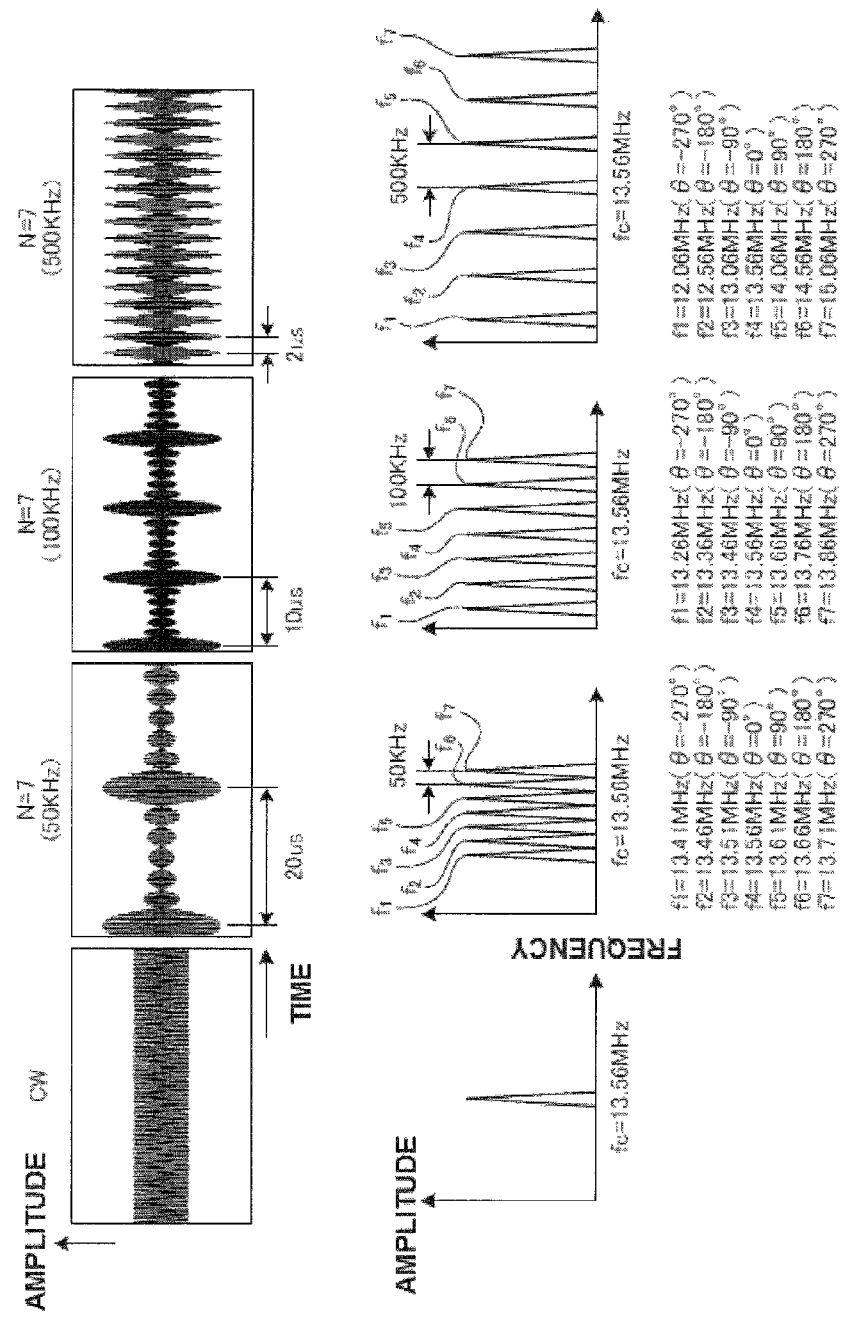
FIG. 26 shows examples of waveforms of electrical signals of a carrier wave group on the basis of a frequency interval $\Delta f$.

Next, the variation of the waveforms of the electrical signals of the carrier wave group by the variation of the frequency interval Δf will be described. FIG. 26 shows examples of the waveforms of the electrical signals of the carrier wave group on the basis of the frequency interval Δf. The examples in FIG. 26 show the case of setting the central frequency fc to 13.56 MHz and varying the frequency interval Δf of the carrier waves f1 to f7. Graphs in the lower side of FIG. 26 show frequencies and amplitudes of the carrier waves f1 to f7 in the case of setting the frequency interval Δf of the carrier waves f1 to f7 to 50 KHz, 100 KHz and 500 KHz. In the graphs in the lower side of FIG. 26, the horizontal axis represents a frequency and the vertical axis represents an amplitude. The frequencies and the amplitudes of the respective carrier waves f are shown below the respective graphs. In the CW, the amplitude of the carrier wave having the central frequency fc of 13.56 MHz is shown. In the upper side of FIG. 26, waveforms of the electrical signals of the carrier wave group in which the carrier waves f1 to f7 shown in the lower side are combined are illustrated. In the graphs in the upper side of FIG. 26, the horizontal axis represents time and the vertical axis represents an amplitude.

There is no resonance in the waveform of CW because only a carrier wave having a frequency fc exists. On the other hand, the waveforms obtained when the frequency interval Δf is set to 50 KHz, 100 KHz and 500 KHz have peaks having large amplitudes and peaks having small amplitudes in a time domain by the resonance of the carrier waves. The cycle in which the peaks having large amplitudes occur is the same as the frequency interval Δf.

Next, the variation of the waveforms of the electrical signals of the carrier wave group by the variation of the amplitudes of the carrier waves will be described. FIG. 27 shows examples of the waveforms of the electrical signals of the carrier wave group which are obtained by varying the amplitudes of the carrier waves. The examples in FIG. 27 show the case of setting the central frequency fc to 13.56 MHz and the frequency interval Δf to 100 KHz and varying the amplitudes of the carrier waves f1 to f3 and f5 to f7 with respect to the amplitude of the carrier wave f4 having the central frequency fc. In graphs in the upper side of FIG. 27, the horizontal axis represents a frequency and the vertical axis represents an amplitude. In the lower side of FIG. 27, waveforms of the electrical signals of the carrier wave group in which the carrier waves f1 to f7 are combined in the case of setting the amplitudes X of the carrier waves f1 to f3 and f5 to f7 with respect to the amplitude of the carrier wave f4 to 0, 0.2 (20%), 0.5 (50%), 0.8 (80%) and 1 (100%) are illustrated. In the graphs in the lower side of FIG. 27, the horizontal axis represents time and the vertical axis represents an amplitude.

There is no resonance in the waveform obtained when X is 0 (CW) because only a carrier wave having a frequency fc exists. On the other hand, the waveforms obtained when X is 0.2, 0.5 and 0.8 have peaks having large amplitudes and peaks having small amplitudes in a time domain by the resonance of the carrier waves. As X is increased, an amplitude difference between a peak having a large amplitude and a peak having a small amplitude is increased. The waveform obtained when X is 1 is the same as the waveform obtained when N is 7 in FIG. 26. This is because the carrier waves f1 to f7 have the same amplitude.

The waveforms of the electrical signals of the carrier wave group vary depending on the combined carrier waves. The control unit Cnt may change the waveform of the carrier wave group by changing the number N of the generation circuits 110 for generating a carrier wave group in the carrier wave group generation unit 100, the frequencies of the carrier waves generated in the respective generation circuits 110, the shift amount of the phase in the phase shifter 112, and the amplification factor of the carrier wave in the power amplifier 113 by controlling the parameters for specifying the carrier waves generated by the carrier wave group generation unit 100. FIGS. 28A to 28D show examples of specification of the carrier waves. Further, FIGS. 28A to 28D show conditions of the carrier waves f1 to f13 generated by thirteen generation circuits 110 arranged in parallel in the carrier wave group generation unit 100. FIG. 28A shows the conditions of the carrier waves f1 to f13 in the case of setting the central frequency fc to 13.56 MHz, the number N to 13 and the frequency interval Δf to 100 KHz. FIG. 28B shows the conditions the conditions of the carrier waves f1 to f13 in the case of setting the central frequency fc to 13.56 MHz, the number N to 7 and the frequency interval Δf to 10 KHz. FIG. 28C shows the conditions the conditions of the carrier waves f1 to f13 in the case of setting the central frequency fc to 13.56 MHz, the number N to 13 and the frequency interval Δf to 10 KHz. FIG. 28D shows the conditions the conditions of the carrier waves f1 to f13 in the case of setting the central frequency fc to 13.56 MHz, the number N to 10 and the frequency interval Δf to 10 KHz. "ON/OFF" indicates an ON state of the generation circuit 110 in which the carrier wave is generated or an OFF state of the generation circuit 110 in which the carrier wave is not generated. "Frequency [MHz]" indicates a frequency of a generated carrier wave. "Initial phase [°]" indicates a phase for shifting a carrier wave. "Relative power" indicates a relative power of a carrier wave. The carrier wave is amplified and an amplitude thereof is increased as the relative power is increased.

The carrier wave group generation unit 100 generates a carrier wave group represented by an amplitude waveform in which a first peak and a second peak of which absolute value is smaller than an absolute value of the first peak alternately appear in a time domain by combining electrical signals of a plurality of carrier waves generated based on the parameters set by the control unit Cnt.

In the plasma processing apparatus 10 configured as described above, a gas is introduced into the processing chamber 12 from the gas injection openings 34*a* of the electrode plate 34 of the upper electrode 30. The carrier wave group generated by the carrier wave group generation unit 100 is supplied to the lower electrode LE through the directional coupler 102 and the matching unit 104. When the carrier wave group is supplied to the lower electrode LE, an electric field is generated in the processing space S between the lower electrode LE and the upper electrode 30. The gas introduced into the processing chamber 12 is turned into a plasma by the electric field generated in the processing space S. Accordingly, a plasma is generated in the processing space S. At this time, the lower electrode LE serves as a plasma generation unit for generating a plasma in the processing chamber 12 by using the carrier wave group.

As described above, the plasma processing apparatus 10 according to the second embodiment generates the carrier wave group represented by the amplitude waveform in which the first peak and the second peak alternately appear in a time domain and generates a plasma in the processing chamber 12 by using the corresponding carrier wave group. Therefore, it is possible to alternately generate "plasma ignition peak electric field" and "plasma maintenance electric field" in the processing chamber 12. Accordingly, an excessive increase in plasma density is prevented and the electric field that is enough to maintain a plasma is ensured. As a result, the plasma can be stably maintained under an environment of a low pressure and at a low plasma density. In addition, controllability of the ion energy distribution can be improved.

Further, the carrier wave group generation unit 100 according to the second embodiment generates a carrier wave group by generating carrier waves having different frequencies at a predetermined frequency interval, sequentially shifting phases of the generated carrier waves having different frequencies by a predetermined cycle, and combining the phase-shifted carrier waves having different frequencies. Accordingly, the carrier wave group generation unit 100 can generate various waveforms in which amplitudes of the first peak and the second peak, an interval between the first peak and the second peak, and an interval between the first peak and a next first peak vary.

Figure 29:
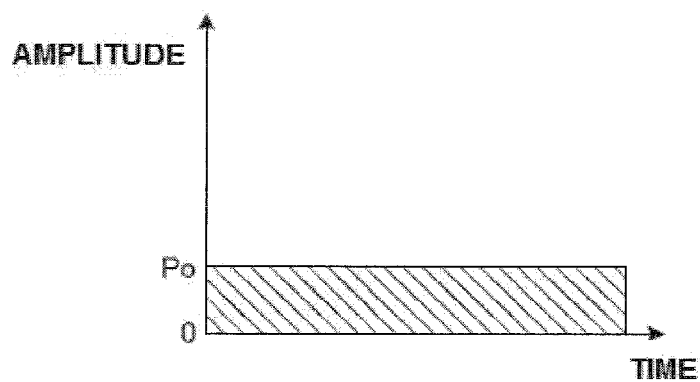
FIG. 29 shows an example of a power supplied to a lower electrode.

Recently, in the plasma etching of a substrate such as a wafer W or the like, a high aspect ratio processing for performing deep etching with respect to a width of an opening is required along with a trend toward miniaturization. In the case of performing high aspect ratio plasma etching, in the plasma processing apparatus, ions need to reach a bottom of a contact hole having a high aspect ratio. When the plasma processing apparatus performs plasma etching by consecutively supplying a high frequency power having a constant amplitude as shown in FIG. 29 from the power supply to the lower electrode LE, for example, if a power P0 supplied to the lower electrode LE is increased to make the ions reach the bottom of the contact hole, the following problem may be generated. FIG. 29 shows an example of the power supplied to the lower electrode.

Figure 30:
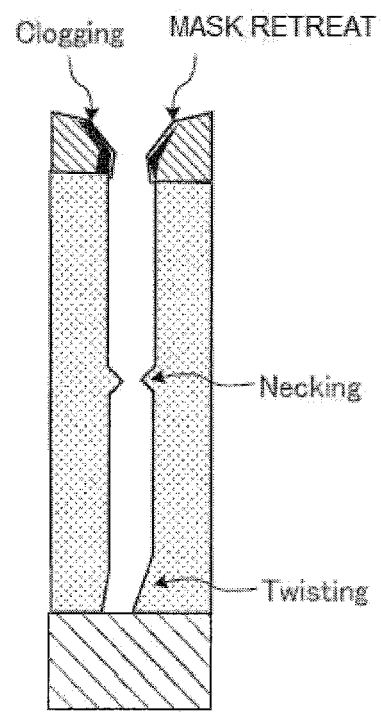
FIG. 30 shows an example of a problem generated in the case of performing plasma etching of a high aspect ratio.

FIG. 30 shows an example of the problem generated in the case of performing the high aspect ratio plasma etching. In the high aspect ratio plasma etching, when a voltage supplied to the lower electrode LE is increased, ions are further accelerated and, thus, a mask may retreat. In addition, the contact hole having a high aspect ratio deteriorates exhaust characteristics. Therefore, clogging or necking may occur in the contact hole due to readhesion of reaction by-products generated at a lower portion of the contact hole, readhesion of reaction by-products exhausted and decomposed by the plasma, or the like. Since only ions having directivity reach the bottom of the contact hole, electrification may occur due to electric charges of the ions. Accordingly, the ions are bent by the electrification and twisting may occur in the contact hole.

Figure 31:
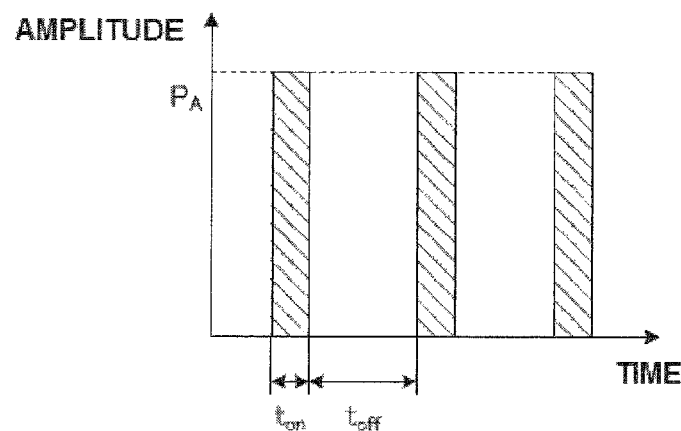
FIG. 31 shows an example of a voltage supplied to the lower electrode.
Figure 32:
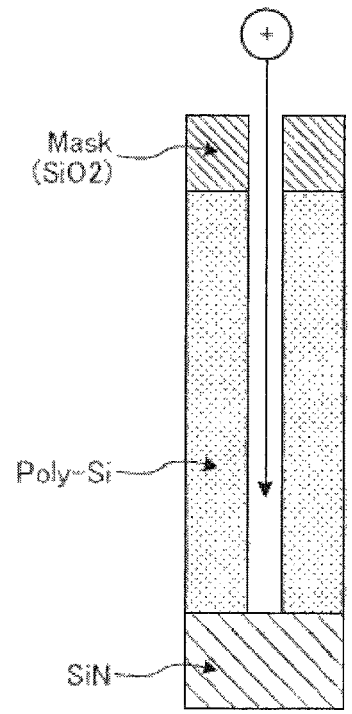
FIG. 32 shows an example of a contact hole having a high aspect ratio which has been subjected to the plasma etching.

Such a problem is improved by supplying the power in a pulsed manner from the power supply to the lower electrode LE. For example, as shown in FIG. 31, the plasma etching is performed by supplying a high frequency power $P_A$ having a constant amplitude in a pulsed manner to the lower electrode LE. FIG. 31 shows an example of the voltage supplied to the lower electrode. This improved mechanism is considered as follows. High-speed ions reach the bottom of the contact hole during a period $t_{on}$ in which the power $P_A$ is supplied. On the other hand, during a period $t_{OFF}$ in which the power $P_A$ is not supplied, a plasma becomes thin and the reaction by-products are hardly decomposed by the plasma. Further, the deposition of the reaction by-products on the sidewall of the contact hole or clogging of the contact hole hardly occurs. During the period $t_{OFF}$, the electrification caused by the electric charges of the ions is suppressed and, thus, the ions are hardly bent. Accordingly, as shown in FIG. 32, the plasma etching of the high aspect ratio contact hole can be performed. FIG. 32 shows an example of the plasma-etched high aspect ratio contact hole.

Figure 33A:
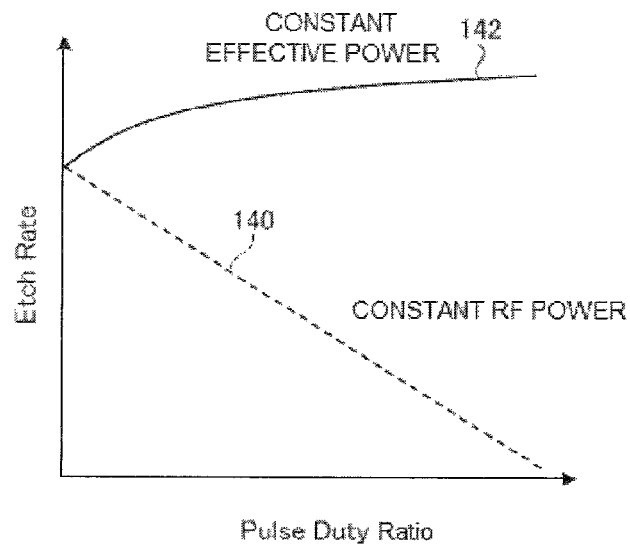
FIG. 33A explains relation between a duty ratio and an etching rate.
Figure 33B:
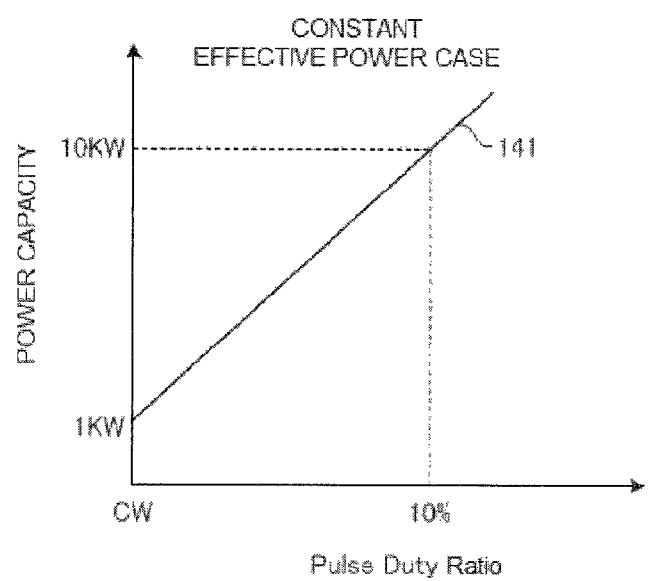
FIG. 33B explains relation between a duty ratio and a capacity of a power supply.

During the period $t_{OFF}$, the power is not supplied to the lower electrode LE and, thus, the etching is not performed. Therefore, in the plasma processing apparatus, in the case of supplying the power to the lower electrode LE in a pulsed manner, the etching rate is decreased when the duty ratio is decreased. For example, when the duty ratio of the power supplied to the lower electrode LE is set to 10%, the power to the lower electrode LE is in an OFF state during 90% of the period. Therefore, when the duty ratio is set to 10%, an effective power contributing to the plasma etching is reduced to 1/10. Accordingly, the etching rate is decreased. In order to obtain the same etching rate as that obtained in the case of consecutively supplying the power to the lower electrode LE, the same effective power is required. For example, when the duty ratio is set to 10%, a power supply capable of supplying ten times greater power is required in order to obtain the same effective power. FIG. 33A explains relation between a duty ratio and an etching rate. In FIG. 33A, the horizontal axis represents a duty ratio and the vertical axis represents an etching rate. FIG. 33B explains relation between a duty ratio and a capacity of a power supply. In FIG. 33B, the horizontal axis represents a duty ratio and the vertical axis represents a capacity of a power supply. It is assumed that the duty ratio in the horizontal axis shown in FIGS. 33A and 33B is decreased toward a right side. As indicated by a dotted line 140 in FIG. 33A, when the duty ratio is decreased, the etching rate is decreased. Therefore, when the effective power is maintained at a constant level by increasing the capacity of the power supply in response to the decrease in the duty ratio as indicated by a solid line 141 in FIG. 33B, the etching rate can be maintained as indicated by a solid line 142 in FIG. 33A.

The plasma processing apparatus can improve the problem generated in etching a high aspect ratio contact hole by supplying the power from the power supply to the lower electrode LE in a pulsed manner. However, in the case of supplying the power from the power supply to the lower electrode LE in a pulsed manner, the plasma processing apparatus requires a power supply having a large capacity. For example, the plasma processing apparatus requires a power supply having a capacity of 10 KW in order to realize the same effective power as that obtained in the case of consecutively supplying the power from the power supply having a capacity of 1 KW to the lower electrode LE by the power having a duty ratio of 10% and supplied in a pulsed manner. Further, in the plasma processing apparatus, when the duty ratio is set to 5%, the effective power becomes 500 W in the case of using the power supply having a capacity of 10 KW. The cost and the size of the power supply are considerably increased as the capacity thereof is increased.

The carrier wave group generation unit 62 of the first embodiment and the carrier wave group generation unit 100 of the second embodiment can generate the carrier wave group represented by the amplitude waveform in which the first peak and the second peak of which absolute value is smaller than an absolute value of the first peak appear alternately in a time domain. Therefore, a waveform functioning in the same manner as the pulse-shaped waveform can be generated. Especially, the carrier wave group generation unit 100 of the second embodiment can generate a waveform close to the pulse-shaped waveform by changing the number N of the generation circuits 110 for generating carrier waves, the frequency of the carrier wave generated by each of the generation circuits 110, the shift amount of the phase in the phase shifter 112, and the amplification factor of the carrier wave in the power amplifier 113. Further, the carrier wave group generation unit 62 of the first embodiment and the carrier wave group generation unit 100 of the second embodiment can generate a carrier wave group having a large amplitude, without increasing capacities of the power supplies of the generation circuits 110 for generating carrier waves, by combining a plurality of carrier waves.

Figure 34:
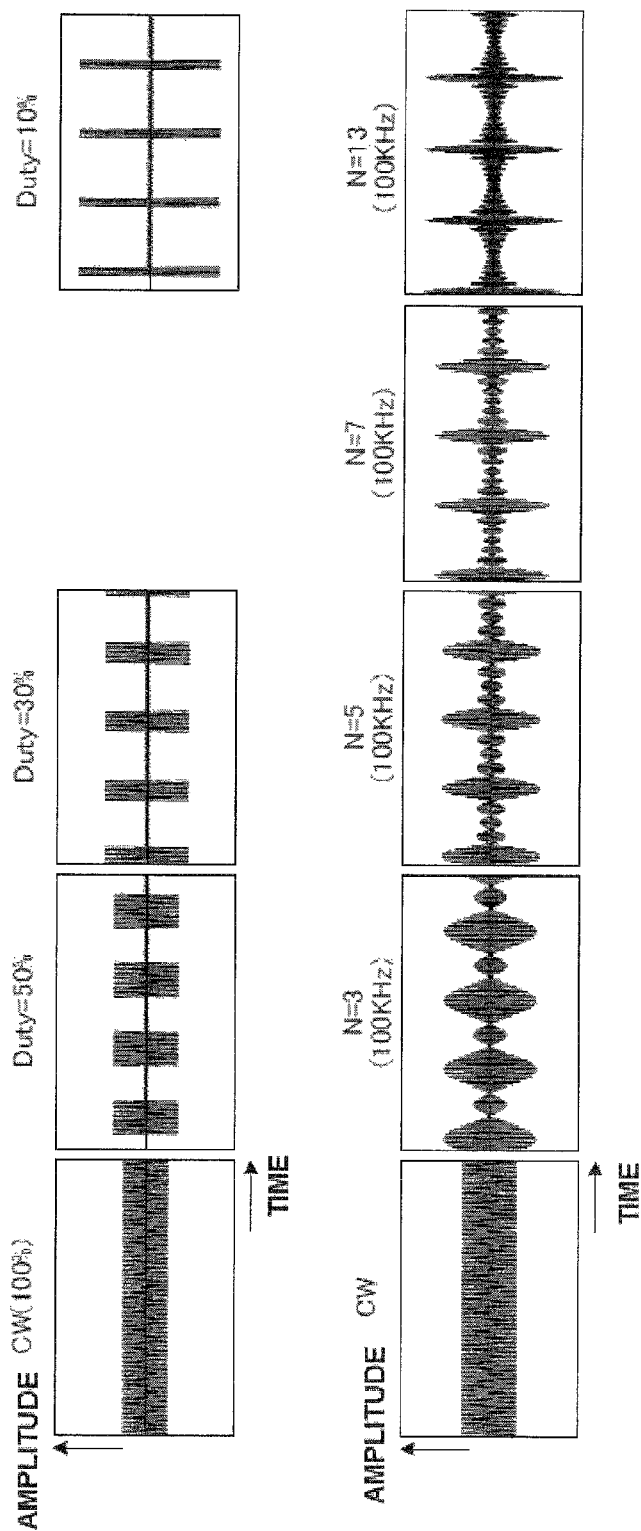
FIG. 34 shows an example of a voltage supplied to the lower electrode.

FIG. 34 shows an example of a voltage supplied to the lower electrode. In an upper side of FIG. 34, waveforms of electrical signals supplied to the lower electrode LE which are obtained in the case of consecutively supplying a high frequency power to the lower electrode LE (duty ratio=100%) and in the case of supplying a high frequency power in a pulsed manner while setting the duty ratio to 50%, 30% and 10% are illustrated. When the duty ratio is 50%, 30% and 10%, the capacity of the power supply is increased and, thus, the amplitude is increased. In a lower side of FIG. 34, there are illustrated waveforms of electrical signals of the carrier wave group supplied to the lower electrode LE which are obtained in the case of setting the central frequency fc to 13.56 MHz, the frequency interval $\Delta f$ to 100 KHz, and the number N of the carrier waves to 1(CW), 3, 5, 7 and 13. In the graphs shown in FIG. 34, the horizontal axis represents time and the vertical axis represents an amplitude. The waveform obtained when the number N is 3 functions in the same manner as the pulse-shaped waveform having a duty ratio of 50%. The waveform obtained when the number N is 5 functions in the same manner as the pulse-shaped waveform having a duty ratio of 30%. The waveform obtained when the number N is 13 functions in the same manner as the pulse-shaped waveform having a duty ratio of 10%.

Figure 35:
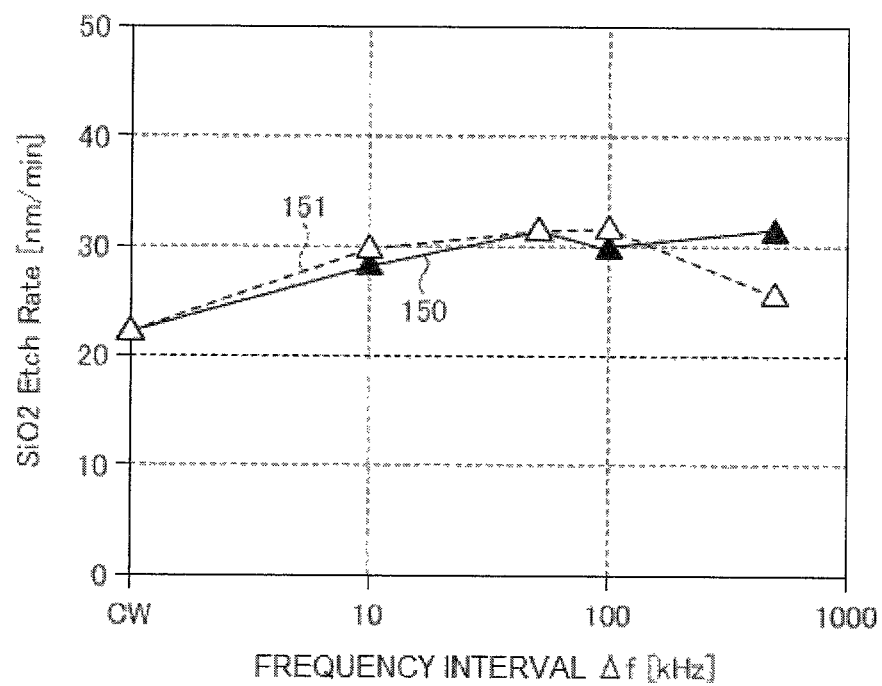
FIG. 35 shows an example of a comparison result of etching rates.

Next, an example of a result of plasma etching using the carrier wave group of the carrier wave group generation unit 100 according to the second embodiment will be described. FIG. 35 shows an example of a comparison result of etching rates. The example in FIG. 35 shows an etching rate in the case of performing plasma etching on an $SiO_2$ wafer W. In FIG. 35, the horizontal axis represents a frequency interval $\Delta f$ and the vertical axis represents an etching rate. In FIG. 35, a line 150 indicates an etching rate obtained by performing plasma etching while setting the central frequency fc to 13.56 MHz and the number N of the carrier waves to seven and varying the frequency interval $\Delta f$. Further, in FIG. 35, a dotted line 151 indicates an etching rate obtained by performing plasma etching while setting an appearance cycle of a period $t_{on}$ in the pulse-shaped waveform having a duty ratio of 30% to a cycle corresponding to the frequency interval $\Delta f$. As can be seen from FIG. 35, the same etching rate as that obtained in the pulse-shaped waveform can be obtained by the carrier wave group generation unit 100 of the second embodiment.

As described above, the carrier wave group generation unit 100 according to the second embodiment generates a carrier wave group by generating carrier waves having different frequencies at a predetermined frequency interval, sequentially shifting phases of the generated carrier waves having different frequencies by a predetermined cycle, and combining the phase-shifted carrier waves having different frequencies. Accordingly, the carrier wave group generation unit 100 can generate an electrical signal of the carrier wave group which functions in the same manner as the pulse-shaped waveform using a power supply having a large capacity by combining the carrier waves without using a power supply having a large capacity. Since the power supply having a large capacity may not be used, the carrier wave group generation unit 100 can save the cost of the power supply and scale-down the size of the power supply.

The above embodiments have described the case in which the frequencies of the carrier waves generated by the signal generators 111, the shift amounts of the phases by the phase shifters 112 and the amplification factors of the carrier waves by the power amplifiers 113 can be changed by controlling the parameters by the control unit Cnt. However, the present disclosure is not limited thereto. The frequencies of the carrier waves generated by the signal generators 111, the shift amounts of the phases by the phase shifters 112, and the amplification factors of the carrier waves by the power amplifiers 113 may be fixed. For example, the signal generators 111 may generate electrical signals of carrier waves f while fixing the central frequency fc to 13.56 MHz at a predetermined frequency interval $\Delta f$ (e.g., frequency interval $\Delta f$). The phase shifters 112 may shift the phases by 90° with respect to the carrier wave adjacent to a lower frequency. The power amplifiers 113 may amplify the carrier waves at a predetermined amplification factor.

Further, the above embodiments have described the case in which the number of carrier waves f generated by the carrier wave group generation unit 100 is an odd number. However, the number of the carrier waves f may be an even number. In that case, the carrier waves f are generated such that frequencies thereof are symmetrical with respect to the central frequency. For example, when four carrier waves f1 to f4 are generated while setting the central frequency fc to 13.56 MHz and the frequency interval $\Delta r$ to 100 KHz, the frequency of the carrier wave f1 is set to 13.41 MHz. The frequency of the carrier wave f2 is set to 13.51 MHz. The frequency of the carrier wave f3 is set to 13.61 MHz. The frequency of the carrier wave f4 is set to 13.71 MHz. In the above embodiments, the plasma processing apparatus 10 using a CCP as a plasma source has been described as an example. However, the plasma source is not limited to the CCP, and an ICP (Inductively Coupled Plasma) may be used. In the case of using the ICP as a plasma source, the carrier wave group generated by the carrier wave group generation unit 62 is supplied to an ICP antenna. An inductive electric field is generated in the processing chamber 12 by the ICP antenna to which the carrier wave group is supplied. A plasma is generated in the processing chamber 12 by the inductive electric field. At this time, the ICP antenna serves as a plasma generation unit for generating a plasma in the processing chamber 12 by using the carrier wave group.

While the disclosure has been shown and described with respect to the embodiments, it will be understood by those skilled in the art that various changes and modifications may be made without departing from the scope of the disclosure as defined in the following claims.

What is claimed is:

1. A plasma processing apparatus comprising:
a processing chamber;
a carrier wave group generation unit configured to generate a carrier wave group including a plurality of carrier waves having different frequencies in a frequency domain, the carrier wave group being represented by an amplitude waveform in which a first peak and a second peak of which absolute value is smaller than an absolute value of the first peak alternately appear in a time domain; and
a plasma generation unit configured to generate a plasma in the processing chamber by using the carrier wave group.

2. The plasma processing apparatus of claim 1, wherein a amplitude difference between the first peak and the second peak in the amplitude waveform varies depending on a ratio of an amplitude value of a carrier wave, among the carrier waves, corresponding to a central frequency of the carrier wave group to an amplitude value of a carrier wave, among the carrier waves, other than the carrier wave corresponding to the central frequency of the carrier wave group.

3. The plasma processing apparatus of claim 1, wherein a ratio of an appearance time of the first peak to a sum of the appearance time of the first peak and an appearance time of the second peak in the amplitude waveform varies depending on the number of the carrier waves.

4. The plasma processing apparatus of claim 1, wherein a time interval between two adjacent first peaks in the amplitude waveform varies depending on a frequency interval of the carrier waves.

5. The plasma processing apparatus of claim 1, wherein the carrier wave group generation unit includes:
a waveform data generation unit configured to generate a waveform data;
a quantization unit configured to quantize the waveform data;
an inverse Fourier transformation unit configured to separate I data and Q data of the waveform data by inverse-Fourier-transforming the quantized waveform data; and
a modulator configured to generate the carrier wave group by modulating reference carrier waves, which have different phases by 90°, by using the I data and Q data of the waveform data, respectively.

6. The plasma processing apparatus of claim 5, wherein the waveform data generation unit generates, as the waveform data, a first waveform data during a first time period and a second waveform data different from the first waveform data during a second time period after the first time period, and
the modulator generates the carrier wave group based on the first waveform data during the first time period and generates the carrier wave group based on the second waveform data during the second time period.

7. The plasma processing apparatus of claim 5, wherein the waveform data generation unit generates, as the waveform data, a synthesized waveform data obtained by combining a first waveform data and a second waveform data different from the first waveform data, and
the modulator generates the carrier wave group, based on the synthesized waveform data, which is represented by the amplitude waveform in which the first peak and the second peak alternately appear and a third peak appears at an arbitrary time in the time domain.

8. The plasma processing apparatus of claim 1, wherein the carrier wave group generation unit includes:
a carrier wave generation unit configured to generate carrier waves having different frequencies at a predetermined frequency interval;
a shift unit configured to sequentially shift phases of the carrier waves having different frequencies which are generated by the carrier wave generation unit by a predetermined cycle; and
a combining unit configured to generate the carrier wave group by combining the carrier waves having different frequencies and the phases shifted by the shift unit.

9. The plasma processing apparatus of claim 8, wherein the shift unit shifts the phases of the carrier waves having different frequencies by 90° with respect to a carrier wave adjacent to a lower frequency.

10. The plasma processing apparatus of claim 8, wherein the carrier wave group generation unit further includes:
an amplification unit configured to amplify the carrier waves having different frequencies and the phases shifted by the shift unit,
wherein the shift unit shifts the phases of the carrier waves having different frequencies such that phases after the amplification become a desired cycle by converting changes in the phases by the amplification unit, and
wherein the combining unit generates the carrier wave group by combining the carrier waves having different frequencies which have been amplified by the amplification unit.

11. A plasma processing method comprising:
generating a carrier wave group including a plurality of carrier waves having different frequencies in a frequency domain, the carrier wave group being represented by an amplitude waveform in which a first peak and a second peak of which absolute value is smaller than an absolute value of the first peak alternately appear in a time domain; and
generating a plasma in a processing chamber by using the carrier wave group.

* * * * *